(12) United States Patent  (10) Patent No.: US 7,969,175 B2
Hendrickson et al.  (45) Date of Patent: Jun. 28, 2011

(54) SEPARATE TEST ELECTRONICS AND BLOWER MODULES IN AN APPARATUS FOR TESTING AN INTEGRATED CIRCUIT

(75) Inventors: David S. Hendrickson, Los Gatos, CA (US); Jovan Jovanovic, Santa Clara, CA (US); Donald P. Richmond, II, Palo Alto, CA (US); William D. Barraclough, San Ramon, CA (US)

(73) Assignee: Aehr Test Systems, Fremont, CA (US)

( * ) Notice: Subject to any disclaimer, the term of this patent is extended or adjusted under 35 U.S.C. 154(b) by 110 days.

(21) Appl. No.: 12/437,465

(22) Filed: May 7, 2009

(65) Prior Publication Data

US 2010/0283475 A1 Nov. 11, 2010

(51) Int. Cl.
*G01R 31/02* (2006.01)
*G01R 31/26* (2006.01)

(52) U.S. Cl. .............. 324/762.06; 324/537; 324/754.09; 324/754.13; 324/757.01; 324/758.03; 324/762.01

(58) Field of Classification Search ........... 324/754–765
See application file for complete search history.

(56) References Cited

U.S. PATENT DOCUMENTS

| | | | |
|---|---|---|---|
| 5,814,733 | A | 9/1998 | Khoury et al. |
| 6,628,520 | B2 * | 9/2003 | Patel et al. ................. 361/696 |
| 7,074,246 | B2 | 7/2006 | Berner et al. |
| 2002/0067180 | A1 * | 6/2002 | Jaimsomporn et al. ....... 324/760 |
| 2003/0062888 | A1 * | 4/2003 | Magliocco et al. ........ 324/158.1 |
| 2003/0112025 | A1 * | 6/2003 | Hamilton et al. ............. 324/760 |
| 2006/0197546 | A1 * | 9/2006 | Co et al. ..................... 324/760 |
| 2006/0273809 | A1 | 12/2006 | Miller et al. |
| 2009/0051381 | A1 * | 2/2009 | Hosoda et al. ............... 324/760 |

* cited by examiner

*Primary Examiner* — Ha Tran T Nguyen
*Assistant Examiner* — Emily Y Chan
(74) *Attorney, Agent, or Firm* — Stephen M. DeKlerk; SNR Denton US LLP

(57) ABSTRACT

The invention relates to an apparatus for testing an integrated circuit of an electronic device.

81 Claims, 16 Drawing Sheets

SEPARATE TEST ELECTRONICS AND BLOWER MODULES IN AN APPARATUS FOR TESTING AN INTEGRATED CIRCUIT

BACKGROUND OF THE INVENTION

This invention relates to test equipment for testing devices having electrical circuits including integrated circuits.

When fabrication of electronic devices, such as computer processors and memories, has been completed, the electronic devices are subjected to burn-in and electrical testing in order to identify and eliminate defective devices before shipment. The term "burn-in" relates to operation of an integrated circuit at a predetermined temperature or temperature profile, typically an elevated temperature in an oven. Certain operating electrical bias levels and/or signals are supplied to the electronic devices while they are at the elevated temperature. The use of the elevated temperature, electrical bias and functional input signals accelerates stress to which the devices are subjected during burn-in, so that marginal devices that would otherwise fail shortly after being placed in service fail during burn-in, and are therefore not shipped.

SUMMARY OF THE INVENTION

The invention relates to an apparatus for testing an integrated circuit of an electronic device, including an apparatus frame, a power source mounted to the apparatus frame, a power electrical path connecting the power source to power contacts on the electronic device, a signal source; and a plurality of signal electrical paths, each connecting the signal source to a respective signal contact on the electronic device.

The apparatus may further include a blower mounted to the apparatus frame, the blower blowing air through at least part of the apparatus frame.

In the apparatus, the apparatus frame may include a test electronics frame and a blower frame, the power source and the signal source being located in the test electronics frame and jointly forming part of a test electronics module, and the blower being mounted the blower frame and jointly being part of a blower module, the test electronics module and the blower module being removably mounted to one another.

In the apparatus, the apparatus frame may further include a driver electronics part and an oven part, the blower being an oven blower and the blower frame being an oven blower frame housing the electronics device, the oven blower being mounted to the oven blower frame and jointly being part of an oven blower module, the oven blower blowing air through the oven blower part.

In the apparatus, the apparatus frame may further include a driver blower frame, further including a driver electronics blower mounted to the driver electronics blower frame and jointly being part of a driver electronics blower module, the driver blower blowing air through the driver electronics part, the test electronics module and the driver electronics module being removably mounted to one another.

The apparatus may further include a blower bearing mount secured to the apparatus frame, wherein the blower includes a blower bearing held by the lower bearing mount, a blower input shaft held by the blower bearing and being rotatable relative to the blower bearing mount; and a fan mounted on the shaft to rotate together with the shaft.

The apparatus may further include a blower motor bearing mount secured to the apparatus frame, a blower motor including, a blower motor body secured to the apparatus frame, a blower motor stator held by the blower motor body, a blower motor rotor rotatably held by the blower motor body, a blower motor output shaft connected to the blower motor rotor for rotation therewith, the blower input shaft being driven by the blower motor output shaft.

The apparatus may further include a blower motor pulley connected to the blower motor output shaft, a blower pulley connected to the blower input shaft; and a drive belt running over the motor pulley and the blower pulley.

The apparatus may further include spacer component between the apparatus frame and a selected one of the mounts, the spacer component being removable to permit removal of the drive belt.

In the apparatus, the selected mount may be the blower bearing mount, the blower pulley being located between the blower bearing and the fan.

The apparatus may further include first and second sets of opposing rails, first and second sides of a respective device holder being releasably held by opposing rails of the first and second sets of rails.

The apparatus may further include a device holder substrate, a plurality of device holder terminals on the device holder substrate, each for contacting a respective contact on a respective electronic device, a plurality of device holder signal contacts secured to the device holder substrate, each device holder signal contact having a surface for releasably mating with a respective surface of a respective signal connector terminal, a plurality of device holder signal conductors connecting the device holder signal contacts to device holder terminals connected to signal contacts on the electronic devices, a power contact secured to the device holder substrate, the power connector having a contact surface for releasably mating with a respective surface of a respective power connector terminal; and at least one device holder power conductor connecting the device holder board power contact to a power contacts on one of the electronic devices.

The apparatus my further include an interior frame that is removably located within the apparatus frame, the interior frame having first and second opposing vertical sides and the first and second sets of opposing rails being located on first and second opposing side walls, respectively, of the subframe.

In the apparatus, the interior frame may have third and fourth opposing side walls, further including third and fourth sets of opposing rails being located on the third and fourth opposing vertical sides of the subframe, first and second sides of a first electronics board being releasably held by opposing rails of the third and fourth sets of rails and the first electronics board electrically connecting to the device holder subassembly.

In the apparatus, the interior frame may have a fifth vertical side opposing the fourth side wall, further including fifth and sixth sets of opposing rails being located on the fourth and fifth opposing vertical sides of the subframe, first and second sides of a second electronics board being releasably held by opposing rails of the fifth and sixth sets of rails and the second electronics board electrically connecting to the device holder subassembly.

The apparatus may further include a first module including a first connector including a connector body, a first set of connector terminals on the connector body for connecting to respective ones of a first set of device holder contacts of a device holder, a first set of connector contacts on the connector body for connecting to respective ones of a first set of board terminals of a board; and a first set of connector conductors carried by the connector body and connecting the first set of connector terminals to the first set of connector contacts.

The apparatus may further include a second set of connector terminals on the connector body, the second set of connector terminals being spaced from the first set of connector terminals in a direction that the device holder engages with the connector body.

In the apparatus, the device holder may include first and second sets of device holder contacts spaced from one another on a device holder substrate and contacting the first and second sets of connector terminals respectively.

In the apparatus, the device holder may further include a second set of connector contacts on the connector body, the second set of connector contacts being spaced from the first set of connector contacts in a direction that the board engages with the connector body.

In the apparatus, the first set of connector conductors may connect the first connector terminals with the first connector contacts, further including a second set of connector conductors connecting the second set of connector contacts with the second set of connector terminals.

The apparatus may further include a first set of terminal spring portions, each terminal spring portion of the first set of terminal spring portions urging a respective connector terminal of the first set of connector terminals against a respective board contact of the first set of board contacts, a second set of terminal spring portions, each terminal spring portion of the second set of terminal spring portions urging a respective connector terminal of the second set of connector terminals against a respective board contact of the second set of board contacts, a first set of contact spring portions, each contact spring portion of the first set of contact spring portions urging a respective connector contact of the first set of connector contacts against a respective board contact of the first set of board contacts; and a second set of terminal spring portions, each terminal spring portion of the second set of terminal spring portions urging a respective connector terminal of the second set of connector terminals against a respective board terminal of the second set of board terminals.

In the apparatus, the board may include first and second sets of board terminals spaced from one another on a board substrate and contacting the first and second sets of connector contacts respectively.

The apparatus may further include a first insulation piece secured against the connector body.

In the apparatus, the first integrated module may include a feedthrough board including, a feedthrough board substrate, and a first feedthrough board electric conductor carried by the feedthrough board substrate and connected to the first connector contact, the first insulation piece being located against the feedthrough board substrate.

In the apparatus, the first integrated module may further include a second insulation piece secured to the connector body on an opposite side to the first insulation piece.

In the apparatus, the first integrated module may further include a feedthrough board including a feedthrough board substrate, and a first feedthrough board electric conductor carried by the feedthrough board substrate and connected to the first connector contact, the first and second insulation pieces being located against and on opposite sides of the feedthrough board substrate.

The apparatus may further include a plurality of said integrated modules jointly forming an insulated wall.

The apparatus may further include a first driver board including a first driver board substrate, a first driver board electric conductor carried by the driver board substrate, and a first driver board terminal connected to the first driver board electric conductor, a first one of the connector contacts being electrically connected to the first driver board terminal.

In the apparatus, the first connector contact may be offset from a line at right angles to a side of the driver board substrate at the driver board terminal.

The apparatus may further include a backplane board including a backplane substrate, and a first backplane electric conductor carried by the backplane substrate and extending from a first driver board terminal plane through the first diver board terminal to a first connector contact plane through the first connector contact, the first driver board terminal plane and the first connector contact plane being spaced and parallel to one another, the first backplane electric conductor connecting the first driver board terminal and the first connector contacts electrically to one another.

In the apparatus, the first connector contact plane may be parallel to and offset from a plane of the driver board substrate.

The apparatus may further include a feedthrough board including a feedthrough board substrate, and a first feedthrough board electric conductor carried by the feedthrough board substrate and extending in a direction other than at right angles to a plane of the first driver board substrate, the first feedthrough board electric conductor connecting the first driver board terminal and the first connector contacts electrically to one another.

In the apparatus, the first feedthrough board electric conductor may extend in a direction other than at right angles to a plane of the first driver board substrate.

In the apparatus, the first connector contact may be offset from the first driver board terminal in a direction parallel to a plane of the driver board substrate.

The apparatus may further include a second driver board including a second driver board substrate, a second driver board electric conductor carried by the driver board substrate; and a second driver board terminal connected to the second driver board electric conductor, the second driver board terminal being connected to the first driver board terminal.

The apparatus may further include a feedthrough board including a feedthrough board substrate, and a feedthrough board electric conductor carried by the feedthrough board substrate and connecting the first and second driver board terminals to one another.

The apparatus may further include a first backplane board including a first backplane substrate, and a first backplane electric conductor carried by the first backplane substrate and connecting the first driver board terminal and the feedthrough board electric conductor electrically to one another; and a second backplane board including a second backplane substrate separate from the first backplane substrate, and a second backplane electric conductor carried by the second backplane substrate and connecting the second driver board terminal and the feedthrough board electric conductor electrically to one another.

In the apparatus, the first and second backplane substrates may extend in a plane that is at right angles to planes of the first and second driver board substrates and a plane of the feedthrough substrate.

In the apparatus, the first driver board may be a power board and the second driver board may be a signal board.

In the apparatus, the apparatus frame may define a door opening, further including a first translation system mounted to the apparatus frame, a first hinge base mounted to the first translation system, the first translation system allowing for translation of the first hinge base relative to the apparatus frame between a storage position and an operational position a door panel mounted to the first hinge base, the door panel being pivotally movable relative to the first hinge base when the first hinge base is in the operational position between a storage orientation wherein the door opening is open and an closed orientation wherein the door panel closes the door opening, and a latch mechanism that releasably maintains the door in the closed position.

In the apparatus, the apparatus frame may define a door opening, further including a second translation system mounted to the apparatus frame, a second hinge base mounted to the second translation system, the second translation system allowing for translation of the second hinge base relative to the apparatus frame between the storage position and the operational position, the door panel being mounted to the second hinge base, the door panel being pivotally movable relative to the second hinge base when the hinge base is in the operational position between the storage orientation wherein the door opening is open and the closed orientation wherein the door panel closes the door opening.

In the apparatus, the first and second translation systems may be upper and lower translation systems and the door pivots about an axis that is substantially vertical.

The apparatus may further include a connecting structure that secures the first and second hinge bases to one another.

In the apparatus, the first translation system may include a first track that is mounted to the apparatus frame and a first wheel that is rotatably mounted to the first pivot base, the first wheel having an outer surface that rides on the rail.

The invention further provides a device holder subassembly, including a device holder substrate, a plurality of device holder terminals on the device holder substrate, each for contacting a respective contact on a respective electronic device, a plurality of device holder signal contacts secured to the device holder substrate, each device holder signal contact having a surface for releasably mating with a respective surface of a respective signal connector terminal, a plurality of device holder signal conductors connecting the device holder signal contacts to device holder terminals connected to signal contacts on the electronic devices, a power contact secured to the device holder substrate, the power connector having a contact surface for releasably mating with a respective surface of a respective power connector terminal, and at least one device holder power conductor connecting the device holder board power contact to a power contacts on one of the electronic devices.

In the device holder assembly, the connector terminals may include first and second sets of connector terminals, the second set of connector terminals being spaced from the first set of connector terminals in a direction that the device holder engages with the connector body.

In the device holder assembly, the device holder may include first and second sets of device holder contacts spaced from one another on a device holder substrate and contacting the first and second sets of connector terminals respectively.

The invention further provides a method of testing an integrated circuit of an electronic device, including holding the device against a surface of a first device holder so that signal and power terminals of the holder are in contact with signal and power contacts on the electronic device, providing signals through the signal terminals and contacts to the integrated circuit, providing power through the power terminals and contacts to the integrated circuit.

The method may further include blowing air with a blower through at least part of the apparatus frame.

In the method, the apparatus frame may include a test electronics frame and a blower frame, the power source and the signal source being located in the test electronics frame and forming part of a test electronics module, and the blower being mounted the blower frame and being part of a blower module, further including removably mounting the test electronics module and the blower module to one another.

In the method, the apparatus frame may include a driver electronics part and an oven part, the blower being an oven blower and the blower frame being an oven blower frame housing the electronics device, the oven blower being mounted to the oven blower frame and jointly being part of an oven blower module, the oven blower blowing air through the oven blower part.

In the method, the apparatus frame may include a driver blower frame, a driver electronics blower mounted to the driver electronics blower frame and jointly being part of an driver electronics blower module, further including removably mounting the test electronics module and the driver electronics module removably to one another for the driver blower to blow air through the driver electronics part.

The method may further include releasably holding first and second sides of a respective device holder by a opposing rails of first and second sets of rails.

The method may further include removing an interior frame out of the apparatus frame, the first and second sets of opposing rails being located on first and second opposing vertical sides of the subframe.

In the method, the third and fourth sets of opposing rails may be located on third and fourth opposing vertical sides of the subframe, first and second sides of the first electronics board being releasably held by opposing rails of the third and fourth sets of rails and the first electronics board electrically connecting to the device holder subassembly.

In the method, the fifth and sixth sets of opposing rails may be located on the fourth and a fifth opposing vertical sides of the subframe, first and second sides of the second electronics board being releasably held by opposing rails of the fifth and sixth sets of rails and the second electronics board electrically connecting to the device holder subassembly.

The invention further provides a module including a first connector including, a connector body, a first set of connector terminals on the connector body for connecting to respective ones of a first set of device holder contacts of a device holder, a first set of connector contacts on the connector body for connecting to respective ones of a first set of board terminals of a board, and a first set of connector conductors carried by the connector body and connecting the first set of connector terminals to the first set of connector contacts.

The module may further include a second set of connector terminals on the connector body, the second set of connector terminals being spaced from the first set of connector terminals in a direction that the device holder engages with the connector body.

In the module, the device holder may include first and second sets of device holder contacts spaced from one another on a device holder substrate and contacting the first and second sets of connector terminals respectively.

The module may further include a second set of connector contacts on the connector body, the second set of connector contacts being spaced from the first set of connector contacts in a direction that the board engages with the connector body.

In the module, the first set of connector conductors may connect the first connector terminals with the first connector contacts, further including a second set of connector conductors connecting the second set of connector contacts with the second set of connector terminals.

The module may further include a first set of terminal spring portions, each terminal spring portion of the first set of terminal spring portions urging a respective connector terminal of the first set of connector terminals against a respective board contact of the first set of board contacts, a second set of terminal spring portions, each terminal spring portion of the second set of terminal spring portions urging a respective connector terminal of the second set of connector terminals against a respective board contact of the second set of board contacts, a first set of contact spring portions, each contact spring portion of the first set of contact spring portions urging a respective connector contact of the first set of connector contacts against a respective board contact of the first set of board contacts; and a second set of terminal spring portions, each terminal spring portion of the second set of terminal spring portions urging a respective connector terminal of the second set of connector terminals against a respective board terminal of the second set of board terminals.

In the module, the board may include first and second sets of board terminals spaced from one another on a board substrate and contacting the first and second sets of connector contacts respectively.

The module may further include a first insulation piece secured against the connector body.

In the module, the first integrated module may further include a feedthrough board including a feedthrough board substrate, and a first feedthrough board electric conductor carried by the feedthrough board substrate and connected to the first connector contact, the first insulation piece being located against the feedthrough board substrate.

In the module, the first integrated module may further include a second insulation piece secured to the connector body on an opposite side to the first insulation piece.

In the module, the first integrated module may further include a feedthrough board including a feedthrough board substrate, and a first feedthrough board electric conductor carried by the feedthrough board substrate and connected to the first connector contact, the first and second insulation pieces being located against and on opposite sides of the feedthrough board substrate.

BRIEF DESCRIPTION OF THE DRAWINGS

The invention is further described by way of example with reference to the accompanying drawings, wherein.

DETAILED DESCRIPTION OF THE INVENTION

Figure 1:
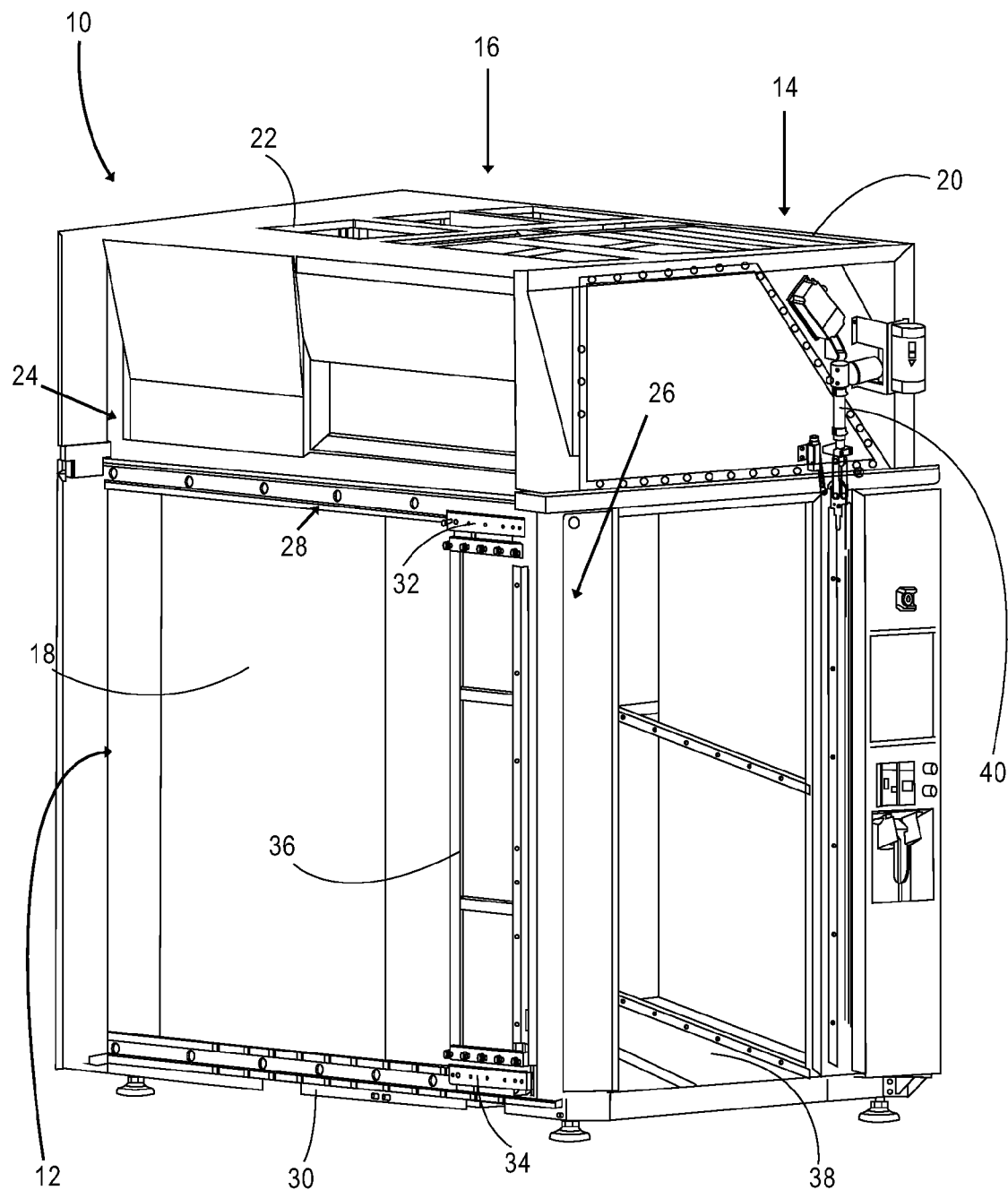
FIG. 1 is perspective view of an apparatus for testing integrated circuits of electronic devices, according to an embodiment of the invention.

FIG. 1 of the accompanying drawings illustrates an apparatus 10 for testing integrated circuits of electronic devices such as unsingulated dies of a wafer or dies within separate integrated circuit packages. The apparatus 10 includes a test electronics module 12, an oven blower module 14, and a driver electronics blower module 16. The modules 12, 14 and 16 are initially separate from one another. It is easier to transport the apparatus 10 when the modules 12, 14 and 16 are separate from one another and the modules 12, 14 and 16 are also sized so that they can fit through existing doorways of fabrication facilities.

The oven blower module 14 and the driver electronics blower module 16 are located side-by-side on top of the test electronics module 12. Following transportation of the modules 12, 14 and 16, the apparatus 10 is assembled as shown in FIG. 1. The test electronics module 12 has a test electronics frame 18, the oven blower module 14 has an oven blower frame 20, and the driver electronics blower module 16 has a driver electronics frame 22. The oven blower frame 20 is then bolted to the test electronics frame 18 and the driver electronics frame 22 is bolted to the test electronics frame 18. The test electronics frame 18, oven blower frame 20, and driver electronics frame 22 then jointly form an apparatus frame 24 with the test electronics frame 18, oven blower frame 20, and driver electronics frame 22 secured to one another. The oven blower module 14 and the driver electronics blower module 16 can still be removed from the test electronics module 12 by removing the bolts that secure the oven blower frame 20 and the driver electronics frame 22 to the test electronics frame 18. It may for example be required to replace the oven blower module 14 with another oven blower module for another purpose. The oven blower module 14 may for example provide air cooling and may have to be replaced by an oven blower module having a water cooling capability.

As further illustrated in FIG. 1, the apparatus 10 includes a door system 26, including upper and lower translation systems 28 and 30, upper and lower hinge bases 32 and 34, a connecting structure 36, a door panel 38 and a latch mechanism 40.

Figure 2:
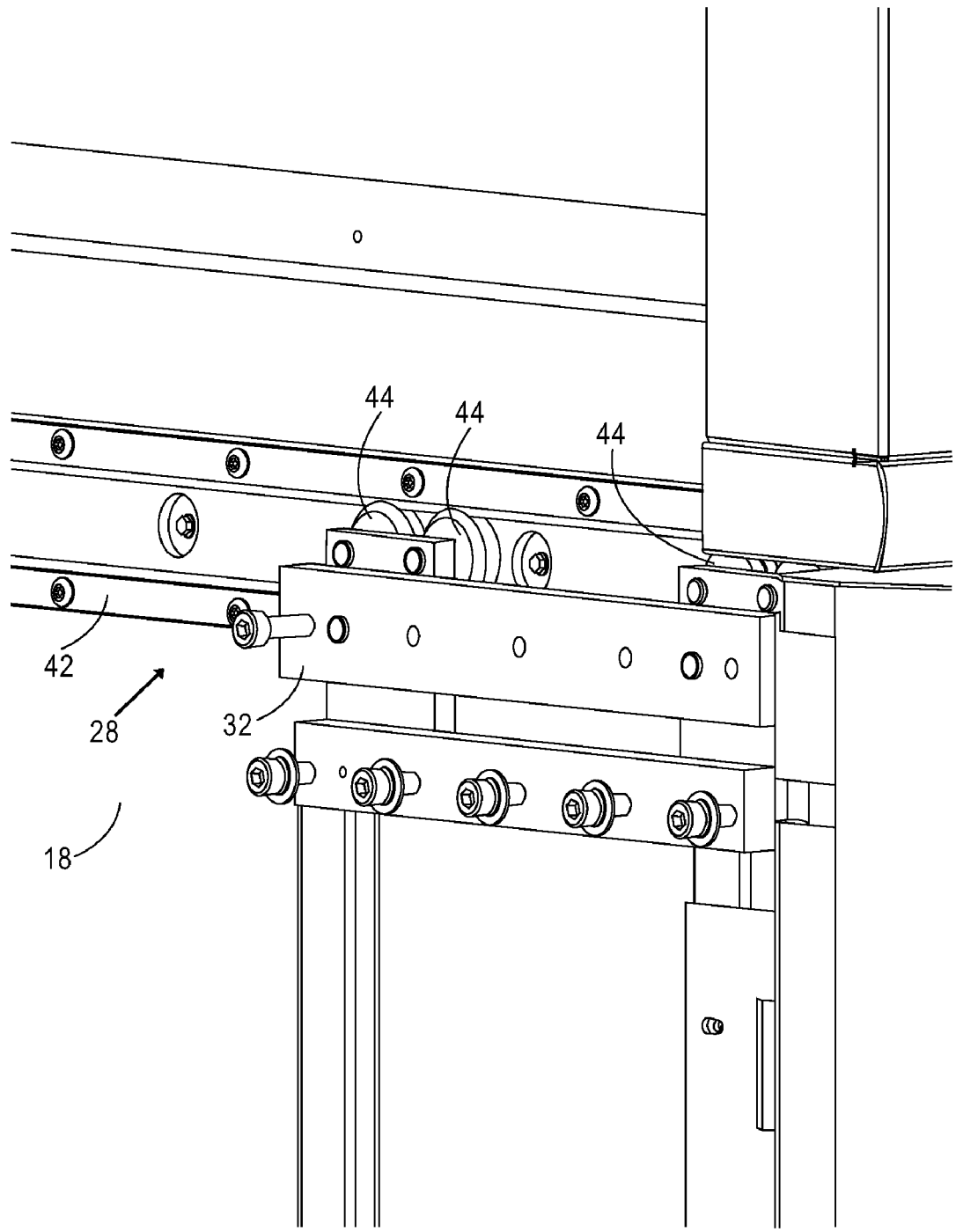
FIG. 2 is perspective view of a door system forming part of the apparatus.

As shown in FIG. 2, the upper translation system 28 includes an upper horizontal track 42 and an upper set of wheels 44. The track 42 is secured to the test electronics frame 18. Each one of the wheels 44 is rotatably secured to the upper hinge base 32. Each one of the wheels 44 has an outer surface that rides on the track 42. The track 42 and the wheels 44 mount the upper hinge base 32 to the test electronics frame 18.

Referring again to FIG. 1, the lower translation system 30 has a similar track-and-roller arrangement as the upper translation system 28. The lower translation system 30 thus mounts the lower hinge base 34 to the test electronics frame 18. The connecting structure 36 is located between the upper and lower hinge bases 32 and 34 and secures the upper and lower hinge bases 32 and 34 to one another so that they move in unison.

The upper and lower hinge bases 32 and 34 are shown in an operational position in FIG. 1, wherein they are located to the right on the upper and lower translation systems 28 and 30. The door panel 38 is pivotally mounted to the upper and lower hinge bases 32 and 34 for pivotal movement about a substantially vertical axis. When the upper and lower hinge bases 32 and 34 are in the operational position as shown in FIG. 1, the door panel 38 can be pivoted into a closed orientation as shown in FIG. 1, wherein the door panel 38 closes a door opening defined in the test electronics frame 18. The latch mechanism 40 is used to maintain the door panel 38 in the closed position.

Figure 3:
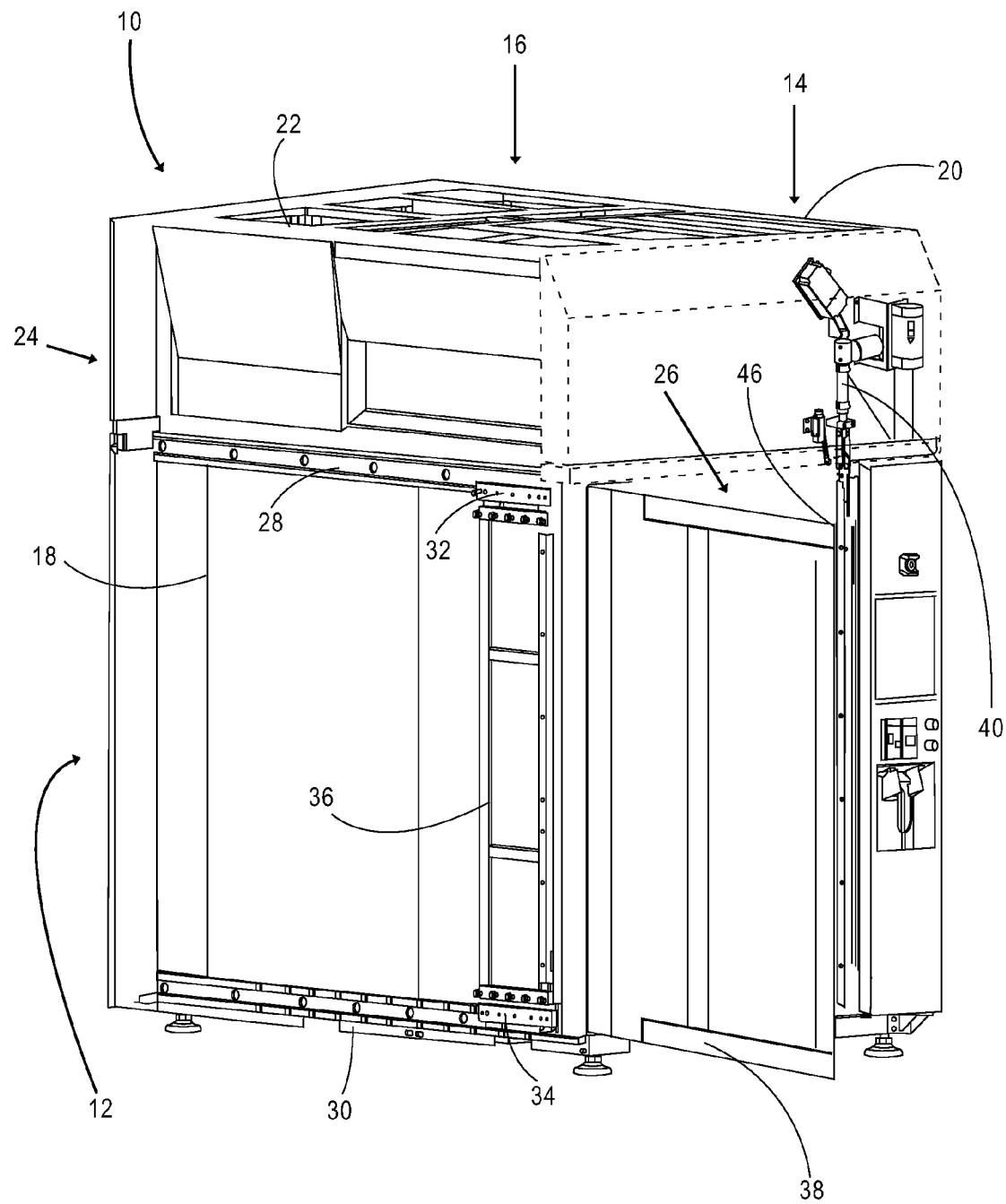
FIG. 3 is a view similar to FIG. 1 after a door panel is rotated from a closed orientation to an open orientation.

As shown in FIG. 3, the latch mechanism 40 can be operated to release the door panel 38 so that it is not maintained in the closed position, whereafter the door panel 38 can be pivoted relative to the upper and lower hinge bases 32 and 34 while the upper and lower hinge bases 32 and 34 are in the operational position. The door panel 38 is pivoted from the closed orientation shown in FIG. 1 to an open orientation shown in FIG. 3 wherein a door opening 46 in the test electronics frame 18 is open.

Figure 4:
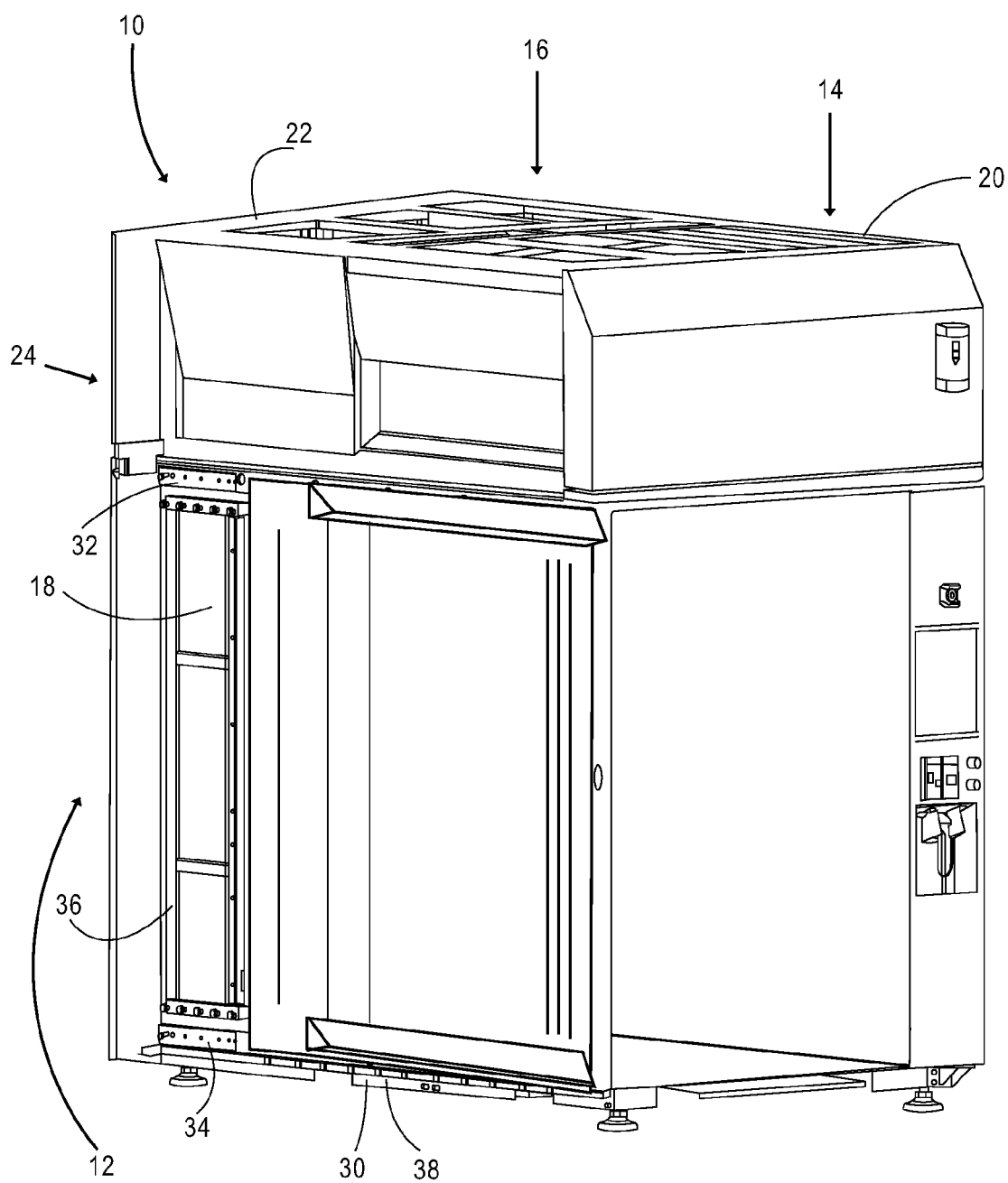
FIG. 4 is a view similar to FIG. 3 after the door panel and upper and lower hinge bases are moved from an operational position into a storage position.

Referring now to FIGS. 3 and 4 in combination, the door panel 38, after moving into the open orientation in FIG. 3 and with the upper and lower hinge bases 32 and 34 in the operational position, can be moved to a storage position shown in FIG. 4, wherein the door panel 38 is located adjacent the test electronics frame 18. The upper and lower hinge bases 32 and 34, the connecting structure 36 and the door panel 38 move in unison into the storage position shown in FIG. 4.

In the storage position shown in FIG. 4, a passageway in front of the door opening 46 is not blocked by the door panel 38. There is thus no need to close the door panel 38 in order to allow for movement through the passage.

In order to again close the door opening 46, the door panel 38 together with the upper and lower hinge bases 32 and 34 and the connecting structure 36 are moved from the storage position shown in FIG. 4 to the position in FIG. 3 wherein the upper and lower hinge bases 32 and 34 are in the operational position and the door panel 38 is in the open orientation. The door panel 38 is then moved from the open orientation shown in FIG. 3 to the closed orientation shown in FIG. 1. The latch mechanism 40 is operated to maintain the door panel 38 in the closed orientation.

Figure 5:
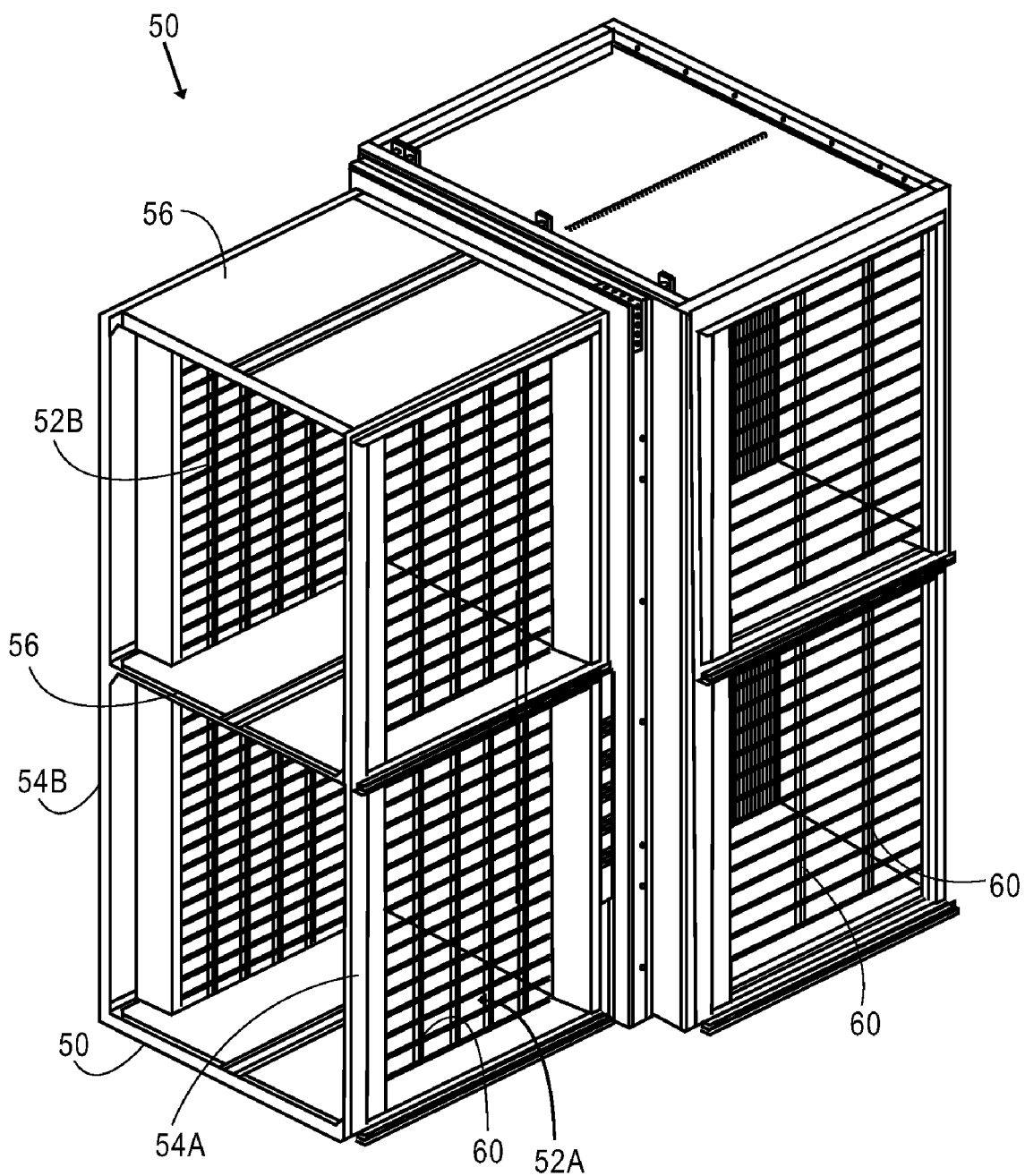
FIG. 5 is perspective view of an interior frame that is located within a test electronics frame of the apparatus of FIG. 4.
Figure 6:
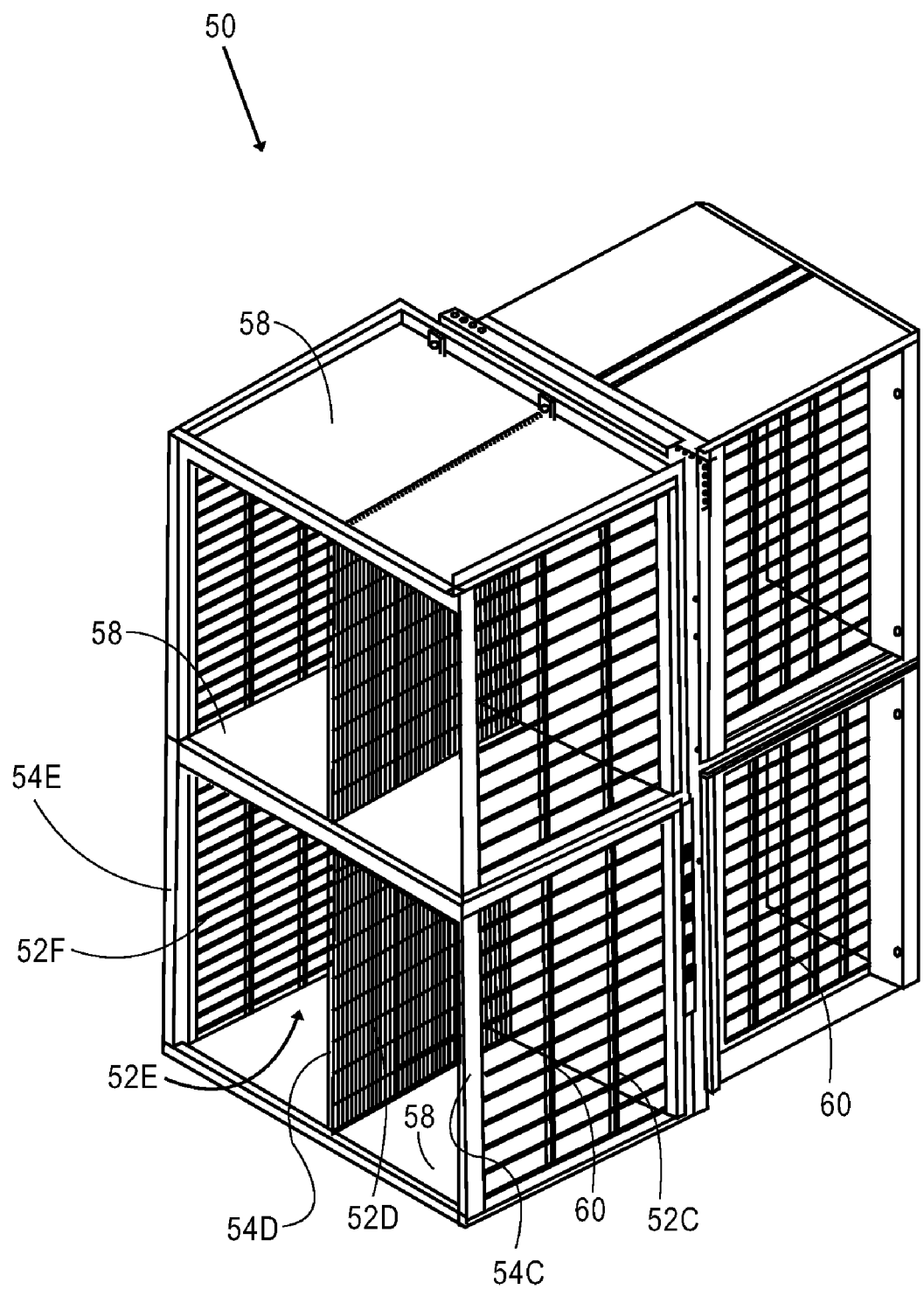
FIG. 6 is a perspective view of the interior frame from an opposing side than in FIG. 5.

FIGS. 5 and 6 illustrate an interior frame 50 and first, second, third, fourth, fifth and sixth sets of rails 52A, 52B, 52C, 52D, 52E and 52F, respectively, located on the interior frame 50. The interior frame 50 is configured with additional electronics boards (not shown) that are located on the rails 52C, 52D, 52E and 52F, whereafter the interior frame 50 is located with the electronics boards and connectors mounted to the electronics boards through a rear door opening (not shown) in FIG. 1 into the test electronics frame 18. Electronic devices are held by a device-holder subassembly such as a burn-in board (not shown) and the burn-in board is located on the rails 52A and 52B and connected to the electronics boards located on the rails 52C, 52D, 52E and 52F.

The interior frame 50 has first, second, third, fourth, and fifth vertical sides 54A, 54B, 54C, 54D and 54E. The vertical sides 54A and 54B oppose one another and the rails 52A and 52B are located on the vertical sides 54A and 54B, respectively. Each one of the rails 52A thus opposes a respective one of the rails 52B. The vertical sides 54C and 54D oppose one another and the rails 52C and 52D are located on the vertical sides 54C and 54D, respectively. The vertical sides 54D and 54E oppose one another and the rails 52E and 52F are located on the vertical sides 54D and 54E, respectively. The rails 52C and 52D oppose one another. The rails 52E and 52F oppose one another.

The interior frame 50 also has horizontal oven panels 56 that connect the vertical sides 54A and 54B to one another to form a subassembly and test electronics panels 58 that connect the vertical sides 54C, 54D and 54E to one another to form a subassembly. The subassembly formed by the oven panels 56 and the vertical sides 54A and 54B is secured to the subassembly formed by the test electronics panels 58 and the vertical sides 54C, 54D and 54E to complete the construction of the interior frame 50. The interior frame 50 is thus a free standing unit before it is inserted into the test electronics frame 18 of FIG. 4 and before it is loaded with electronics boards. The interior frame 50 can also be removed out of the test electronics frame 18 for purposes of reconfiguring the system.

The vertical sides 54A, 54B, 54C, 54D, and 54E are made out of vertical strips 60 with spaces between the vertical strips 60. The spaces between the vertical strips 60 provide openings so that air can flow horizontally through the vertical sides 54A, 54B, 54C, 54D, and 54E into and out of the interior frame 50.

Figure 7:
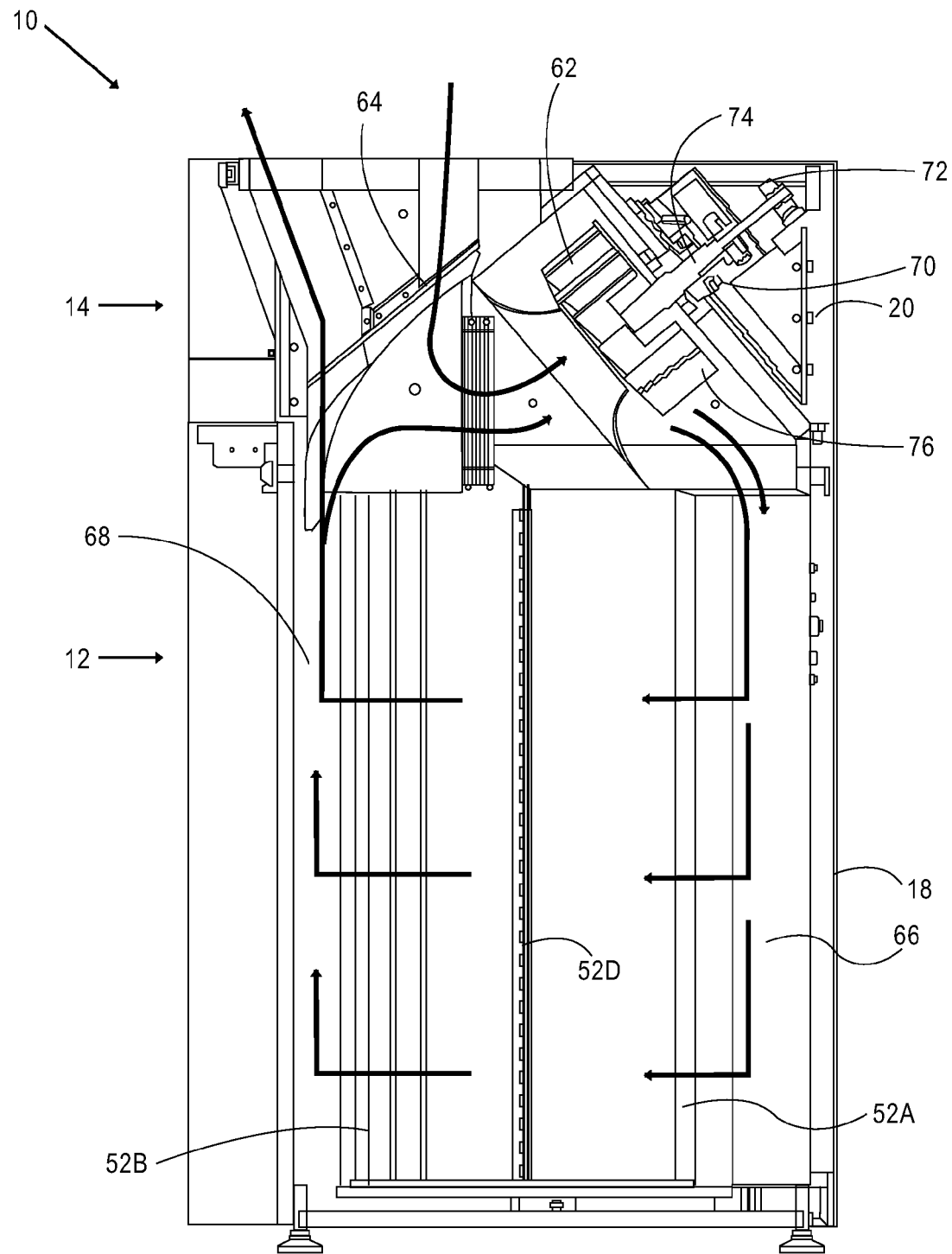
FIG. 7 is a cross-sectional end view through an oven portion of the test electronics module and through an oven blower module of the apparatus.

FIG. 7 illustrates further components of the apparatus 10 including an oven blower 62 and an air channeling piece or damper 64 forming part of the oven blower module 14 and inlet and outlet plenums 66 and 68 forming part of the test electronics module 12.

The oven blower 62 has first and second blower bearings 70 and 72, a blower input shaft 74, and an centrifugal fan 76. The centrifugal fan 76 is mounted to the shaft 74. The shaft 74 is rotatably mounted on the oven blower frame 20 by the first and second bearings 70 and 72.

The damper 64 is mounted to the oven blower frame 20. Air can pass over a surface of the air channeling piece 64 into an inlet of the centrifugal fan 76.

The plenums 66 and 68 are mounted to the test electronics frame 18 on opposing sides of the interior frame 50 (see FIG. 5) such that the plenum 66 is located next to the vertical side 54A and the plenum 68 is located next to the vertical side 54B. The plenum 66 forming part of the test electronics module 12 receives air from an outlet of the centrifugal fan 76 forming part of the oven blower module 14. The plenum 68 forming part of the test electronics module 12 delivers air over the surface of the air channeling piece 64 forming part of the oven blower module 14.

In use, burn-in boards are positioned between the vertical sides 54A and 54B. When power is provided to devices held by the burn-in boards, the devices and the burn-in boards generate heat. Heat is also provided, if needed, by a heater (not shown). The centrifugal fan 76 and the shaft 74 rotate on the first and second bearings 70 and 72 relative to the oven blower frame 20. The centrifugal fan 76 receives air from the plenum 68 over the surface of the damper 64 and provides air to the plenum 66. Parallel streams of air pass from the plenum 66 through the vertical side 54A over the burn-in boards to the plenum 68. Air continues to circulate through the test electronics module 12 and the oven blower module 14 so that air within an oven portion of the test electronics module 12 is at substantially the same temperature as air within the oven blower module 14. The air continues to heat up as the burn-in boards, devices and heater generate more heat. When the temperature within the test electronics module 12 reaches a predetermined temperature, the damper 64, forming part of the oven blower module 14 is opened to atmosphere and the heater is turned off. Air at close to atmospheric temperature is then drawn into the centrifugal fan 76 and heated air from the plenum 68 is vented to atmosphere. Excess heat is thereby removed from the apparatus 10. The heater and damper work together to control the temperature of the air in the chamber.

Figure 8:
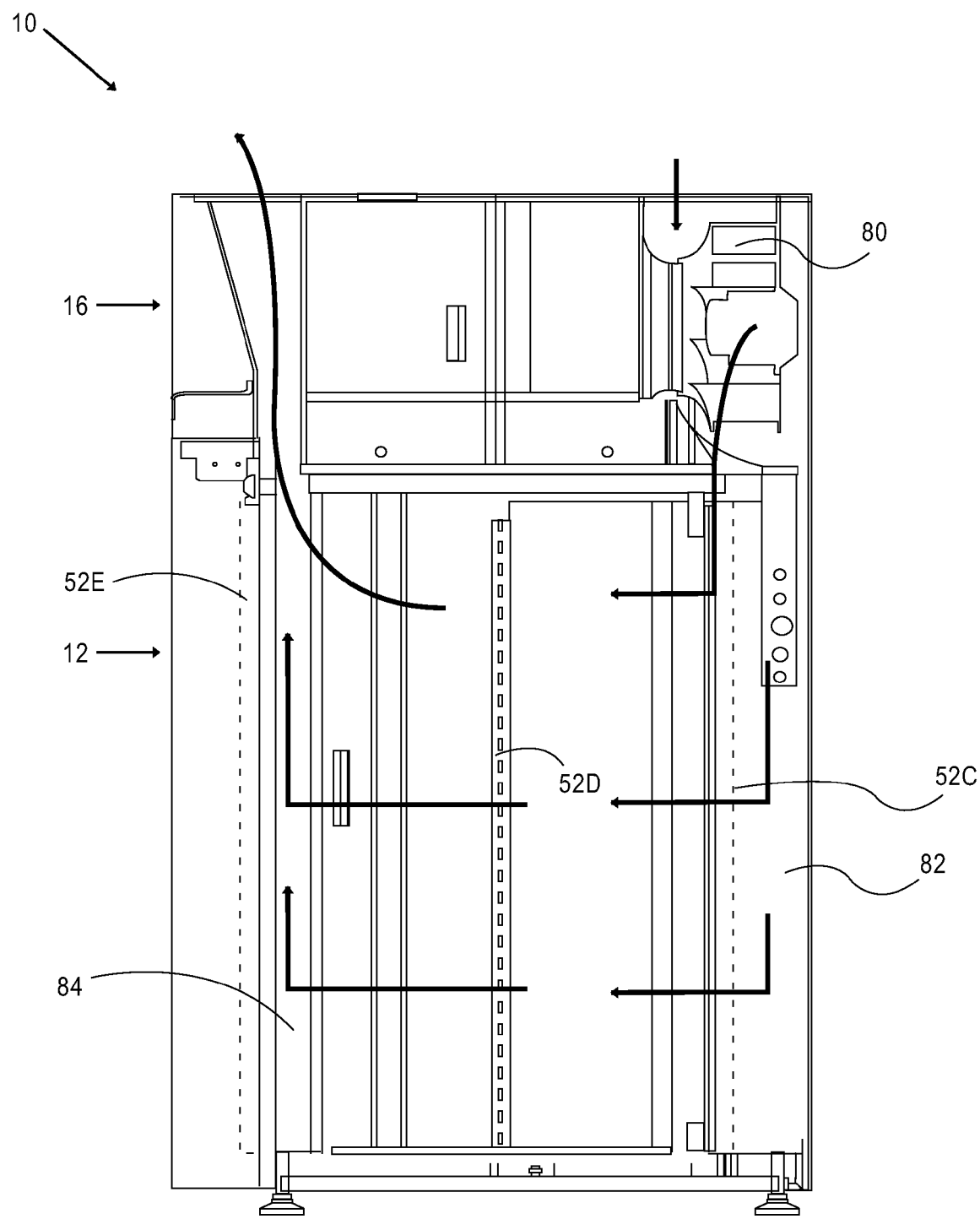
FIG. 8 is a cross-sectional end-view from an opposing side than in FIG. 7 through a driver electronics portion of the test electronics module and through a driver electronics blower module.

FIG. 8 shows further components of the apparatus 10 including a driver electronics blower 80 forming part of the driver electronics blower module 16, and inlet and outlet plenums 82 and 84 forming part of a driver electronics part of the test electronics module 12. Electronics boards are positioned between the vertical sides 54C and 54D and more electronics boards are positioned between the vertical sides 54D and 54E.

In use, the electronics boards positioned between the vertical sides 54C and 54D and between the vertical sides 54D and 54E generate heat. The driver electronics blower 80 receives air from outside the apparatus 10 at atmospheric temperature and provides the air to the plenum 82. Parallel streams of air flow from the plenum 82 to the plenum 84. Each stream of air passes through the vertical side 54C over an electronics board located between the vertical side 54C and the vertical side 54D, through the vertical side 54D over an electronics board located between the vertical side 54D and the vertical side 54E and through the vertical side 54E to the plenum 84. The air then flows from the plenum 84 through the driver electronics blower module 16 to atmosphere. It can thus be seen that heat is continually removed from the driver electronics portion of the test electronics module 12.

Figure 9:
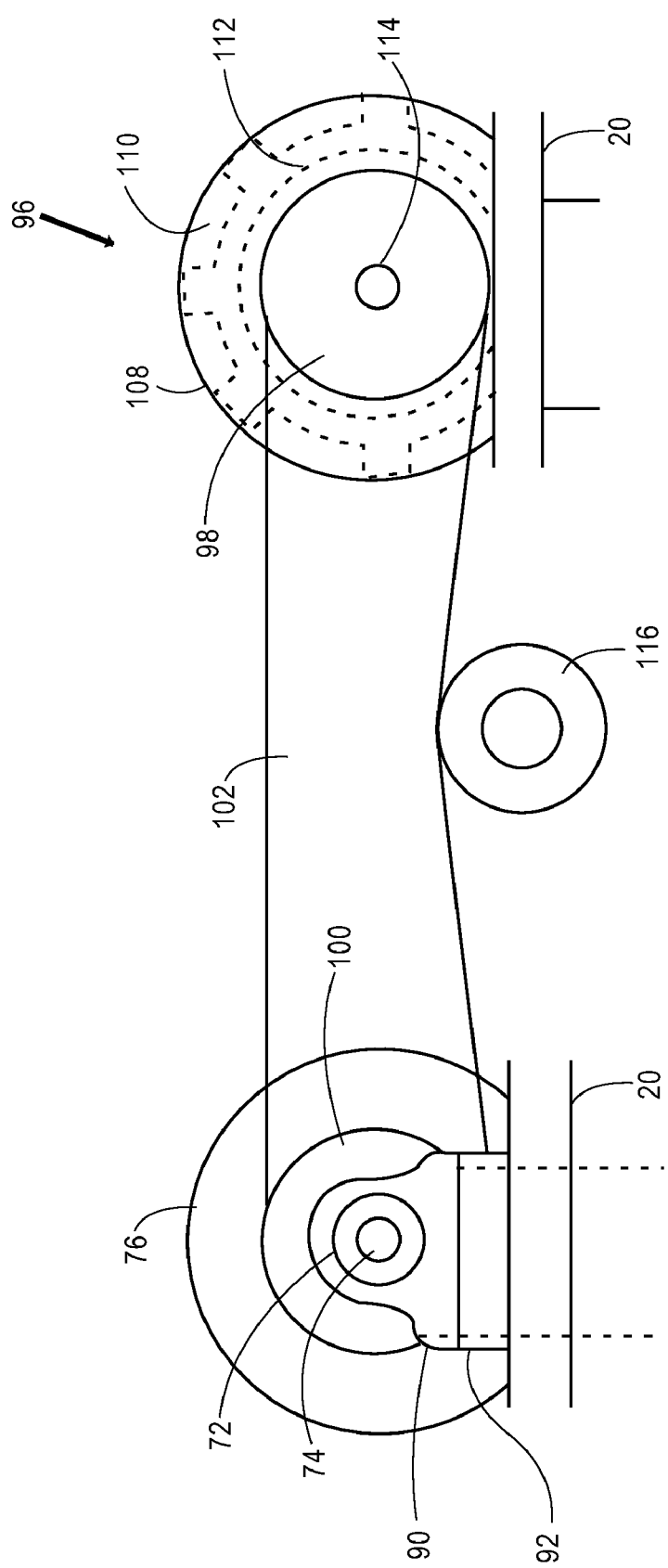
FIG. 9 is a side view illustrating components of the oven blower module.

FIG. 9 illustrates further components of the oven blower module 14 shown in FIG. 7, including a blower bearing mount 90, a spacer component 92, a blower motor 96, a blower motor pulley 98, a blower pulley 100, and a drive belt 102.

The blower motor 96 includes a blower motor body 108, a blower motor stator 110, a blower motor rotor 112, and a blower motor output shaft 114. The blower motor body 108 is mounted in a stationary position on the oven blower frame 20. The blower motor stator 110 is mounted in a stationary position within the blower motor body 108. The blower motor output shaft 114 is mounted to the blower motor body 108 for rotation about an axis of the blower motor output shaft 114. The blower motor rotor 112 is mounted to the blower motor output shaft 114 within the blower motor body 108. One skilled in the art will appreciate that alternating current is provided to the blower motor stator 110. The alternating current within the blower motor rotor 112 creates an alternating magnetic field that induces rotation of the blower motor rotor 112 and the blower motor output shaft 114.

The spacer component 92 is located between the blower bearing mount 90 and the oven blower frame 20, whereafter the blower bearing mount 90 and the spacer component 92 are secured to the oven blower frame 20. The second blower bearing 72 is held the blower bearing mount 90 and the blower input shaft 74 is held by the second blower bearing 72. Another blower bearing mount (not shown) is used to mount the first blower bearing 70 (FIG. 7) to the oven blower frame 20.

The blower motor pulley 98 and the blower pulley 100 are mounted to the blower motor output shaft 114 and the blower input shaft 74 respectively so that they rotate in unison therewith. The drive belt 102 forms a closed loop that runs over the blower motor pulley 98 and the blower pulley 100. An outer surface of the drive belt 102 also runs over an idler roller 116, which is used to tension the drive belt 102. The drive belt 102 provides a transmission of power from the blower motor pulley 98 to the blower pulley 100, and therefore from the blower motor 96 to the centrifugal fan 76.

It should be noted that the terms "pulley" and "belt" should be generically interpreted as encompassing equivalent components such as a "gear" or a "chain," respectively.

The blower pulley 100 is located between the blower bearing mount 90 and the blower bearing mount (not shown) that is used to secure the first blower bearing 70 in FIG. 7. The drive belt 102 can however be removed without entirely disconnecting the oven blower 62 (FIG. 7) from the oven blower frame 20. Bolts and nuts that secure the blower bearing mount 90 and the spacer component 92 to the oven blower frame 20 are undone. Undoing of the nuts and bolts, permits for the spacer component 92 to be removed. After the spacer component 92 is removed, the drive belt 102 can be slipped over the blower bearing mount 90, without removing the blower bearing mount 90 or the blower bearing mount that is used to secure the first blower bearing 70 in FIG. 7 from the shaft 74. A new drive belt (not shown) can then be slipped over the blower bearing mount 90, whereafter the spacer component 92 is positioned between the blower bearing mount 90 and the oven blower frame 20, and the blower bearing mount 90 and the spacer component 92 are again secured to the oven blower frame 20 using the bolts and nuts. The new drive belt is then positioned over the blower motor pulley 98 and the blower pulley 100 and is then tensioned with the idler roller 116.

Figure 10:
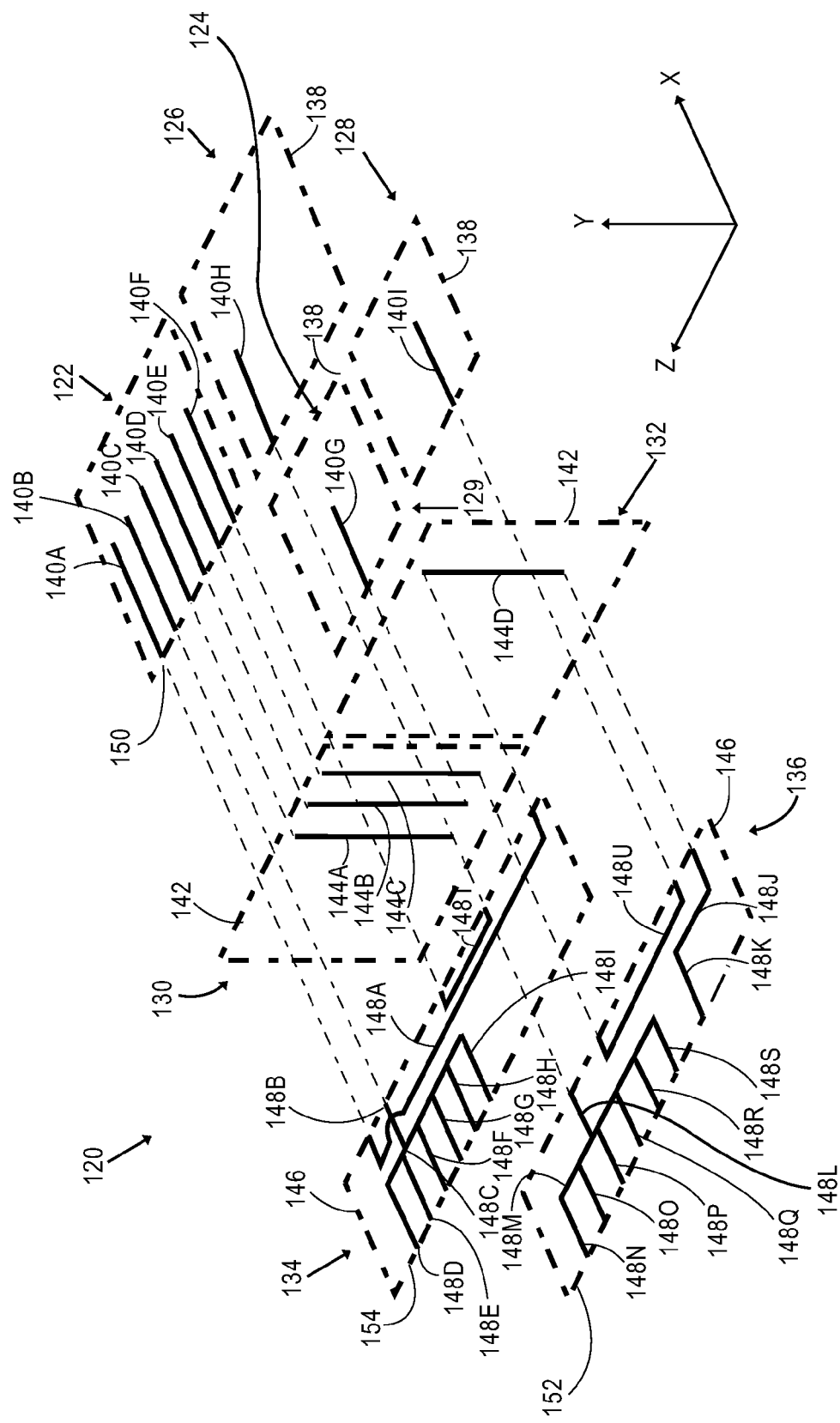
FIG. 10 illustrates an interconnection scheme of an electric tester forming part of the test electronics module.

FIG. 10 illustrates a connection scheme by components of an electric tester 120, including driver boards 122, 124, 126 and 128, first and second backplane boards 130 and 132, and first and second feedthrough boards 134 and 136.

The driver boards 122 and 124 are power boards and the driver boards 126 and 128 are signal boards. Each one of the driver boards 122, 124, 126 and 128 has a respective driver board substrate 138. The driver board substrates 138 are separate from one another. The driver board substrate 138 of the driver boards 122 and 126 are positioned in an upper horizontal plane and the driver board substrate 138 of the driver boards 124 and 128 are located in a lower horizontal plane.

The driver board 122 has a plurality of driver board electric conductors 140A-F carried by the driver board substrate 138 thereof. The driver boards 124, 126 and 128 each has a respective driver board electric conductor 140G, H and I, respectively carried by a respective driver board substrate 138.

Each one of the backplane boards 130 and 132 has a respective backplane board substrate 142. The backplane board substrates 142 are positioned in a vertical plane that intersects the horizontal planes of the driver board substrates 138. The backplane board substrates 142 are separate from one another so that the backplane boards 130 and 132 are not directly connected to one another.

The backplane board 130 has a plurality of backplane board electric conductors 144A-C that are carried by the backplane board substrate 142 thereof. The backplane board 132 has a backplane board electric conductor 144D carried by the backplane board substrate 142 thereof.

The feedthrough boards 134 and 136 each have a respective feedthrough board substrate 146. The feedthrough board substrate 146 of the feedthrough board 134 may or may not be located in the same horizontal plane as the driver board substrates 138 of the driver boards 122 and 126. The feedthrough board substrate 146 of the feedthrough board 136 may or may not be located in the same horizontal plane as the driver board substrates 138 of the driver boards 124 and 128. The feedthrough boards 134 and 136 are located on an opposite side of the plane of the backplane boards 130 and 132 than the driver boards 122, 124, 126 and 128.

The feedthrough board 134 has a plurality of feedthrough board electric conductors 148A-I that are carried by the feedthrough board substrate 146 thereof. The feedthrough board 136 has a plurality of feedthrough board electric conductors 148J-S carried by the feedthrough board substrate 146 thereof.

The driver-board electric conductor 140A extends in a x-direction to an edge 150 of the driver board substrate 138 of the driver board 122. The edge 150 extends in a z-direction. The driver board electric conductor 140A connects through connectors and conductors (not shown) of the backplane board 130 to the feedthrough board electric conductor 148A. The feedthrough board electric conductor 140A extends in a z-direction and is connected to the backplane board electric conductor 144D. The backplane board electric conductor 144D extends in a y-direction and is connected to the feedthrough board electric conductor 148J. The feedthrough board electric conductor 148J extends in a z-direction and is connected to the feedthrough board electric conductor 148K. The feedthrough board electric conductor 148K extends in a x-direction to an edge 152 of the feedthrough board substrate 146. The edge 152 extends in a z-direction.

It can thus be seen that an end of the feedthrough board electric conductor 148K at the edge 152 is in a different horizontal and a different vertical plane than an end of the driver board electric conductor 140A at the edge 150. The feedthrough board electric conductors 148A and 148J provide for connection to a different vertical plane and the backplane board electric conductor 144D provides for connection to a different horizontal plane. Specifically, the feedthrough board electric conductor 148K is off-set from a line at right angles to the edge 150 at a terminal connected to the driver board electric conductor 140A. What should also be noted is that, although the backplane electric conductor 144D extends in a direction at right angles to a horizontal plane of the driver board substrate 138 of the driver board 122, the feedthrough board electric conductors 148A and 148J do not extend in a direction at right angles to the plane of the driver board substrate 138 of the driver board 122.

A further electric connection is provided by the driver board electric conductor 140B and the feedthrough board electric conductors 148B-I. Specifically, the feedthrough board electric conductor 148C provides for horizontal interconnection in a z-direction to distribute resources from the driver board electric conductor 140B to multiple locations along an edge 154 of the feedthrough board substrate 146 of the feedthrough board 134.

A similar arrangement is provided by the driver board electric conductor 140C and the feedthrough board electric conductors 148L-S. In this arrangement, the backplane board electric conductor 144A provides for interconnection from an upper horizontal plane of the driver board 122 to a lower horizontal plane of the feedthrough board 136.

As noted, the driver board electric conductors 140A-C provide resources such as signal, power or ground to the feedthrough boards 134 and 136. The driver board electric conductors 140D-F are used for communication between the driver board 122 and the driver boards 124, 128 and 126, respectively.

The driver board electric conductor 140D extends to the edge 140 and is connected to the backplane board electric conductor 144B. The backplane board electric conductor 144B extends in a y-direction and is connected to the driver board electric conductor 140G. The backplane board electric conductor 144B thus provides for connection from an upper horizontal plane of the driver board 122 to a lower horizontal plane of the driver board 126.

The driver board electric conductor 140E extends to the edge 150 and is connected to the backplane board electric conductor 144C. The backplane board electric conductor 144C extends in a y-direction and is connected to the feedthrough board electric conductor 148U. The feedthrough board electric conductor 148U extends in a z-direction and is connected through connectors and conductors (not shown) of the backplane board 132 to the driver board electric conductor 140I. The backplane board electric conductor 144C provides interconnection from an upper horizontal plane to a lower horizontal plane and the feedthrough electric conductor 148U provides interconnection from one vertical plane to another vertical plane.

The driver board electric conductor 140F is connected through connectors and conductors (not shown) of the backplane board 130 to a feedthrough board electric conductor 148T of the feedthrough board 134. The feedthrough board electric conductor 148T extends in a z-direction and is connected through connectors and conductors (not shown) of the backplane board 132 to the driver board electric conductor 140H. The feedthrough board electric conductor 148T thus provides for interconnection from one vertical plane to another.

All the interconnection schemes that are described with reference to FIG. 10 originate at the driver board 122. It should however be understood that similar connection schemes originate from the driver boards 124, 126 and 128.

As will be commonly understood, the horizontal planes extend in x- and z-directions and the vertical plane described herein extends in y- and z-directions. It will also be understood that the x-, y-, and z-directions are at angles other than 0° relative to one another, specifically at right angles to one another. It will also be appreciated that vertical and horizontal planes are at an angle other than 0° relative to one another, more specifically at right angles to one another.

Figure 11:
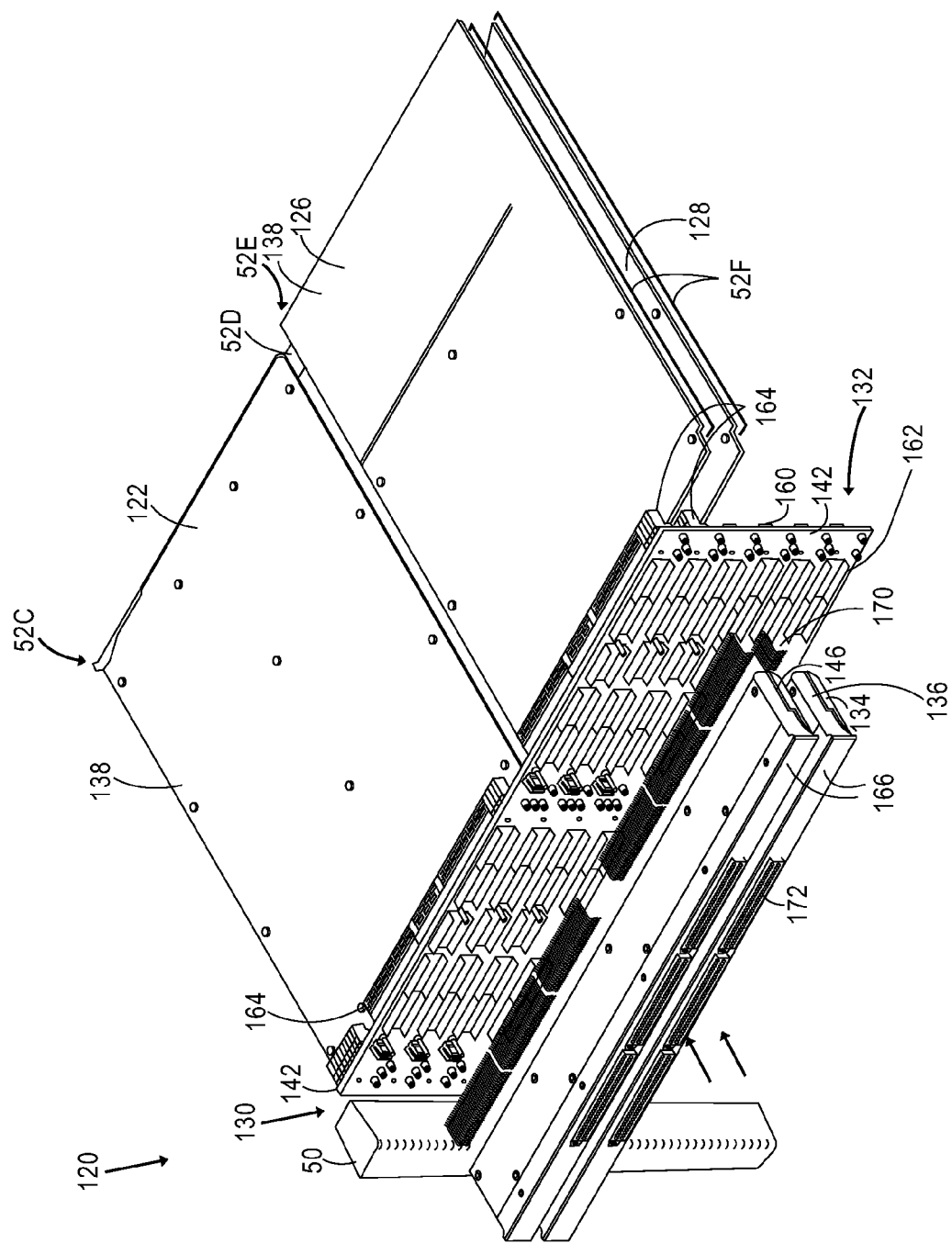
FIG. 11 is a perspective view of the tester of FIG. 10.

FIG. 11 shows further components of the electric tester 120, including first and second sets of backplane connectors 160 and 162, and a plurality of integrated feedthrough modules 166.

The driver board connectors 164 are secured to the respective driver board substrates 138. The driver boards 122, 126 and 128 are positioned on respective sets of rails 52C-52F. For example, the opposing sides of the driver board 126 are supported on one of the rails 52E and one of the rails 52F.

The first and second backplane connectors 160 and 162 are secured to opposing sides of either of the substrates 142 and form part of either of the backplane boards 130 or 132. The backplane board 130 and 132 are mounted to portions of the frame 50. The driver boards 122, 124, 126 and 128 are moved on the rails 52C-52F until the driver board connectors 164 engage with the first backplane connectors 160. Contacts and terminals on the first backplane connectors 160 and the driver board connectors 164 connect the backplane 130 and 132 electrically to the driver boards 122, 124, 126 and 128. The second backplane connectors 162 are connected through conductors in the backplane substrate 142 to the first backplane connectors 160.

Each one of the integrated feedthrough modules 166 has a first feedthrough module connector 170 that is secured to the feedthrough board substrate 146. The first feedthrough module connector 170 has contacts and terminals that connect the feedthrough board, e.g. the feedthrough board 136 electrically to one of the second backplane connectors 162.

Figure 12:
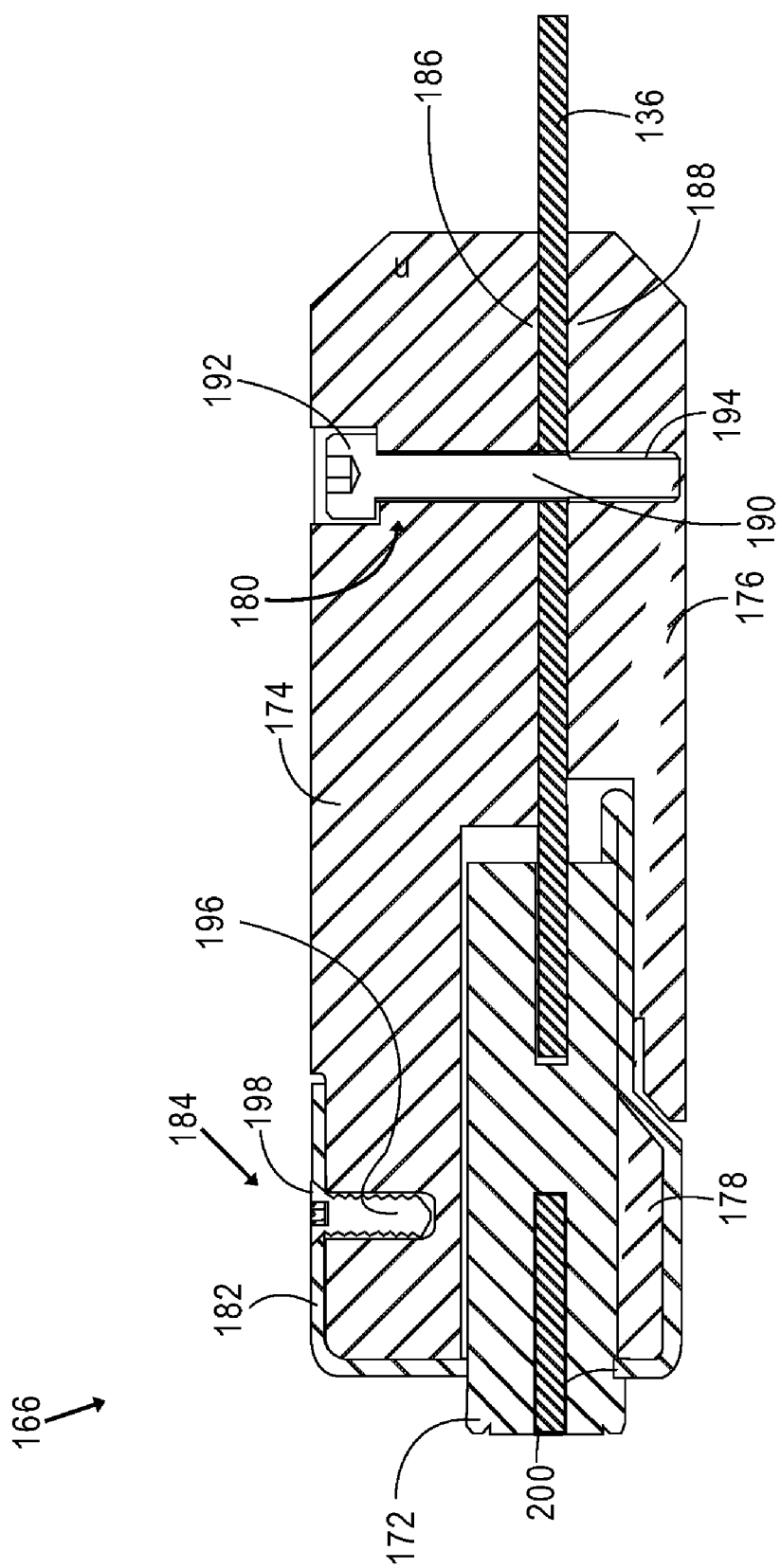
FIG. 12 is cross-sectional side view of a connector module forming part of the tester in FIG. 11.

FIG. 12 illustrates further components of the integrated feedthrough module 166, including a second connector 172, first, second and third pieces of insulation, 174, 176 and 178 respectively, a first fastener 180, a stabilizing piece 182, and a second fastener 184.

The first insulation piece 174 has a lower surface 186 that is located against an upper surface of the feedthrough board 136 and the second insulation 176 has an upper surface 188 that is located against a lower surface of the feedthrough board 136. The fastener 180 has a shank 190 and a larger head 192. The shank 190 is inserted into complementary openings in the first and second insulation pieces 174 and 176. A lower end of the shank 190 has thread 194 that engages with complementary thread of the second insulation piece 176. The head 192 is larger than the opening in the first insulation piece 174. The first fastener 180 thus secures the first and second insulation pieces 174 and 176 to the feedthrough board 136.

The second fastener 184 has a shank 196 and a head 198. The shank 196 is inserted through an opening in the upper portion of the stabilizing piece 182. The shank 196 has thread that engages with complementary thread of the first insulation piece 174. The head 198 engages with the stabilizing piece 182 so that the second fastener 184 secures the stabilizing piece 182 to the first insulation piece 174. The third insulation piece 178 is located on an inner surface of the stabilizing piece 182. The stabilizing piece 182 has a connector opening 200 formed therein. The second connector 172 is inserted though the connector opening 200. The second connector 172 engages structurally and electrically with the feedthrough board 136. It may also be possible to remove the second connector 172 from the feedthrough board 136 by extracting the second connector 172 out of the connector opening 200.

Referring again to FIG. 11, it can be seen that the integrated feedthrough modules 166 are located adjacent one another with a small gap between them. The small gap is filled with an additional insulating piece so that the integrated feedthrough modules 166 and the additional insulating piece form an insulating wall. In another arrangement, the integrated feedthrough modules 166 contact one another so that they form an insulating wall without an additional insulating piece. Because an insulating wall is formed by the integrated feedthrough modules 166, there is no need for an additional insulating wall to insulate the tester 120 from the second connectors 172. The connectors 172 can thus be held at higher temperatures of an oven and the electric tester 120 can be maintained at a lower temperature.

It may happen from time to time that one of the integrated feedthrough modules 166 fails and has to be replaced. The integrated feedthrough module 166 can be removed by simply extracting the first feedthrough connector module 166 from the corresponding second backplane connector 163. Another integrated feedthrough module 166 can be then be positioned in its place. The insulating wall will be broken when the failed integrated feedthrough module 166 is removed, but the insulating wall is again restored when the replacement integrated feedthrough module 166 is inserted.

Figure 13:
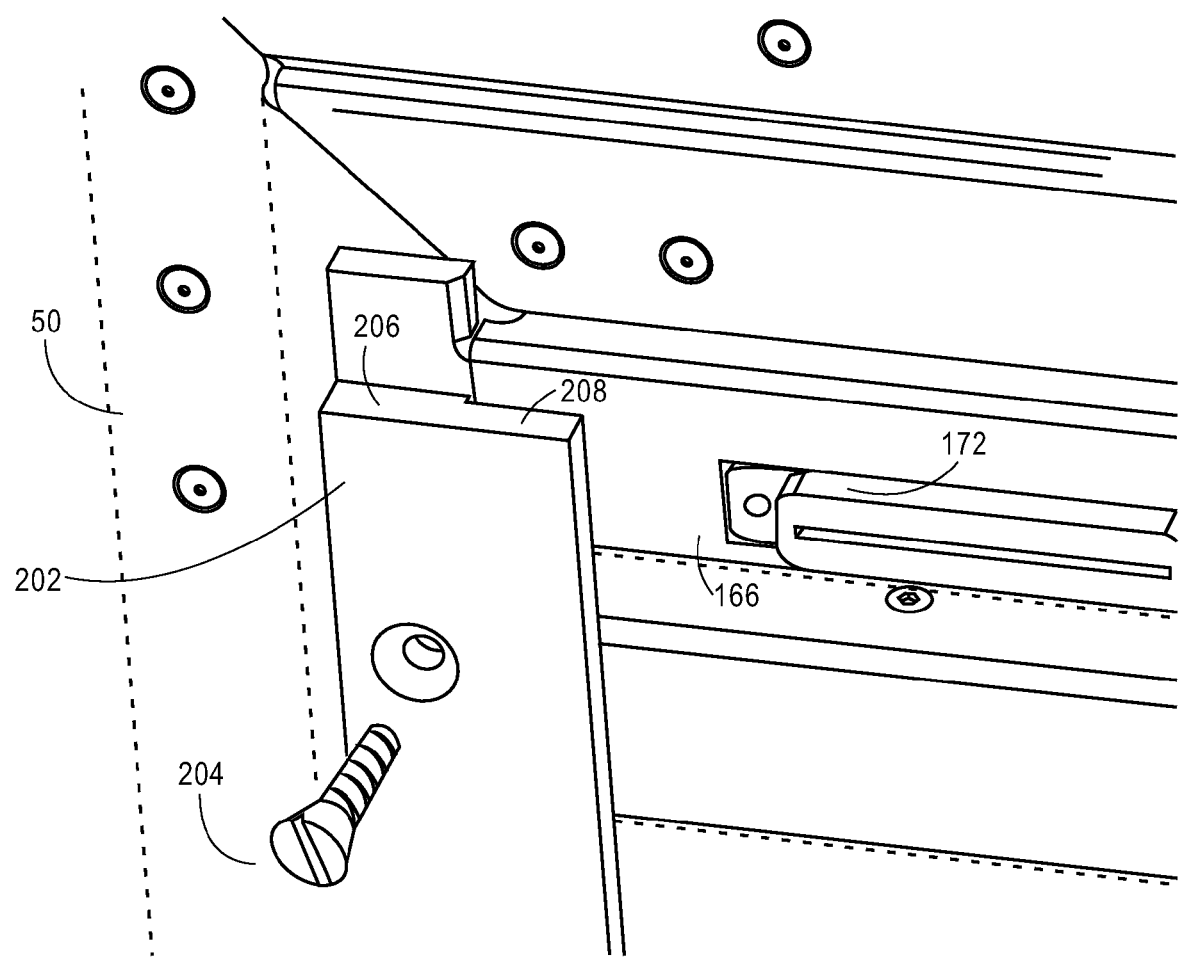
FIG. 13 is a perspective view illustrating how the connector module of FIG. 12 is retained on the apparatus frame.

FIG. 13 shows a retaining piece 202 that is mounted to the frame 50 by a plurality of fasteners 204. The retaining piece 202 has a first portion 206 located against and secured to the frame 50, and a second portion 208 located over a plurality of the integrated feedthrough modules 166. The retaining piece 202 prevents movement of the integrated feedthrough module 166 relative to the frame 50 when a burn-in board is disconnected from the second connector 172.

Figure 14:
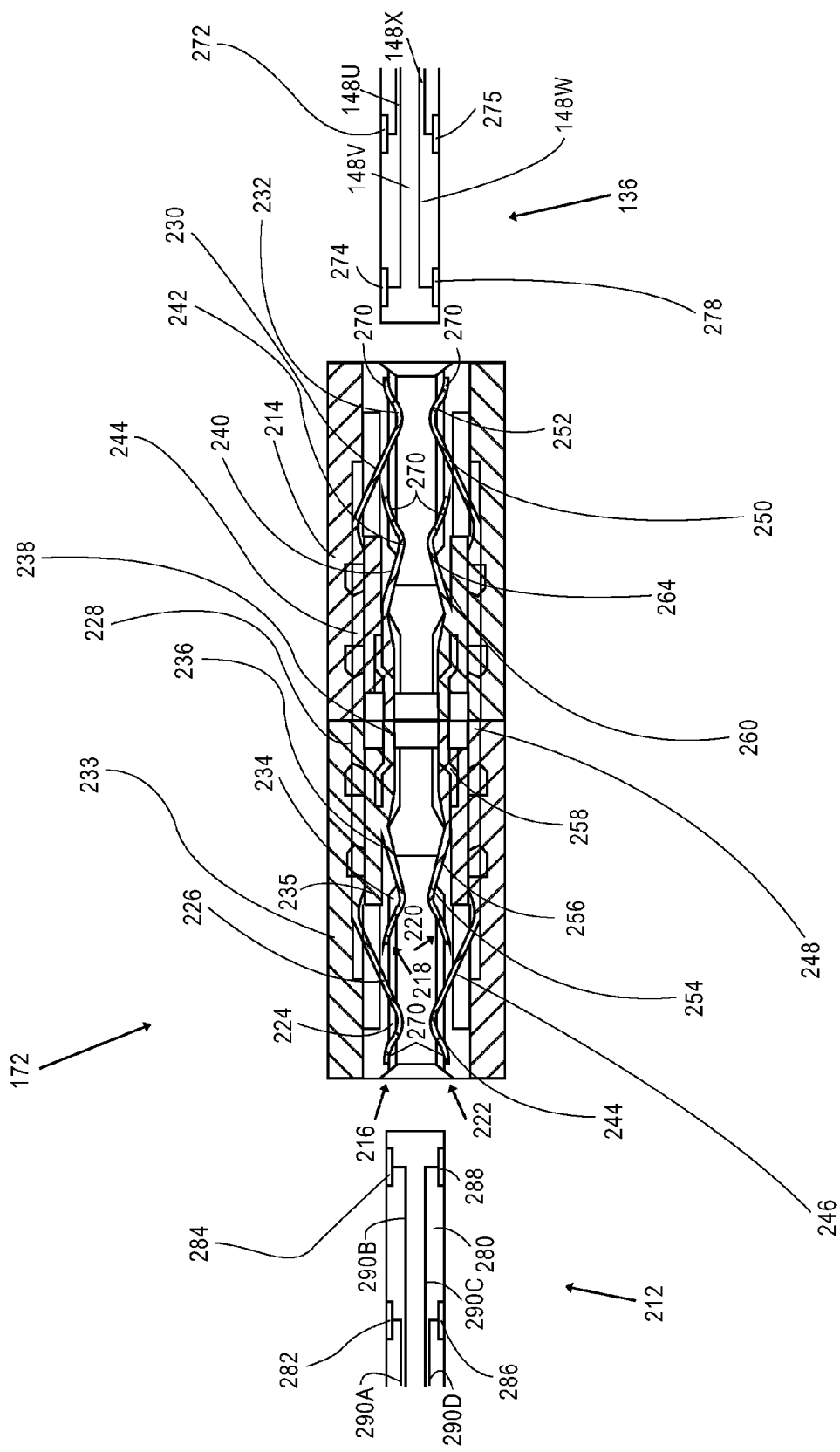
FIG. 14 is a cross-sectional side view illustrating a connector forming part of the connector module of FIG. 12, a feedthrough board and a burn-in board.

FIG. 14 shows the connector 172, the feedthrough board 136 and a burn-in board 212 in more detail.

The connector 172 includes a connector body 214 and first, second, third and fourth conductors 216, 218, 220 and 222 that are carried by the connector body 214.

The first conductor 216 includes a first connector terminal 224, a first terminal spring portion 226, a first connector conductor 228, a first contact spring portion 230, and a first connector contact 232. The connector body 214 has a long outer portion 233 and a short inner portion 235. The first connector conductor 228 is held between the long outer portion 233 and the short inner portion 235 in an upper half of the connector body 214. The first terminal spring portion 226 and the first contact spring portion 230 extend from opposing ends of the first connector conductor 228. The first connector terminal 224 and the first connector contact 232 are located at ends of the first terminal spring portion 226 and the first contact spring portion 230, respectively. The first connector terminal 224 can be depressed in an upward direction against a spring force that is created by the first terminal spring portion 226. Similarly, the first connector contact 232 can be depressed in an upward direction against a spring force that is created by the first contact spring portion 230. Removal of a pressure that depresses the first connector spring terminal 224 or the first connector contact 232 results in downward movement of the first connector terminal 224 or the first connector contact 232.

The second conductor 218 includes a second connector terminal 234, a second terminal spring portion 236, a second connector conductor 238, a second contact spring portion 240, and a second connector contact 242. The second connector conductor 238 is located on a lower surface of the short inner portion 235. The second terminal spring portion 236 and the second contact spring portion 240 extend from opposing ends of the second connector conductor 238. The second connector terminal 234 and the second connector contact 242 are located at ends of the second terminal spring portion 246 and the second contact spring portion 240, respectively. The second connector terminal 234 can be depressed in an upward direction against a spring force that is created by the second terminal spring portion 236. Similarly, the second connector contact 242 can be depressed in an upward direction against a spring force that is created by the second contact spring portion 240. Removal of a pressure that depresses the second connector spring terminal 234 or the second connector contact 242 results in downward movement of the second connector terminal 234 or the second connector contact 242.

The third conductor 222 includes a third connector terminal 244, a third terminal spring portion 246, a third connector conductor 248, a third contact spring portion 250, and a third connector contact 252. The third connector conductor 248 is held between the long outer portion 233 and the short inner portion 235 in a lower half of the connector body 214. The third terminal spring portion 246 and the third contact spring portion 250 extend from opposing ends of the third connector conductor 248. The third connector terminal 244 and the third connector contact 252 are located at ends of the third terminal spring portion 256 and the third contact spring portion 250, respectively. The third connector terminal 244 can be depressed in a downward direction against a spring force that is created by the third terminal spring portion 246. Similarly, the third connector contact 252 can be depressed in a downward direction against a spring force that is created by the third contact spring portion 250. Removal of a pressure that depresses the third connector spring terminal 244 or the third connector contact 252 results in upward movement of the third connector terminal 244 or the third connector contact 252.

The fourth conductor 220 includes a fourth connector terminal 254, a fourth terminal spring portion 256, a fourth connector conductor 258, a fourth contact spring portion 260, a fourth connector contact 264, and the fourth connector conductor 258 is located on an upper surface of the short inner portion 235. The fourth terminal spring portion 256 and the fourth contact spring portion 260 extend from opposing ends of the fourth connector conductor 258. The fourth connector terminal 254 and the fourth connector contact 264 are located at ends of the fourth terminal spring portion 256 and the fourth contact spring portion 260, respectively. The fourth connector terminal 254 can be depressed in a downward direction against a spring force that is created by the fourth terminal spring portion 256. Similarly, the fourth connector contact 264 can be depressed in a downward direction against a spring force that is created by the fourth contact spring portion 260. Removal of a pressure that depresses the fourth connector spring terminal 254 or the fourth connector contact 264 results in upward movement of the fourth connector terminal 254 or the fourth connector contact 264.

Each conductor 216, 218, 220 and 222 terminates into lips 270. A gap is defined between the first connector terminal 224 and the third connector terminal 244 and the lips 270 near the first connector terminal 224 and the third connector terminal 244 define a gap that is wider than the gap between the first connector terminal 224 and the third connector terminal 244. The other lips 270 also define a gap between them that is wider than a respective pair of terminals or contacts near the respective lips.

The second connector terminal 234 is behind the first connector terminal 224 in a direction from left-to-right. Similarly, the fourth connector terminal 254 is behind the third connector terminal 244 in a direction from left-to-right. The second connector contact 242 is behind the first connector contact 232 in a direction from right-to-left. Similarly, the fourth connector contact 264 is behind the third connector contact 252 in a direction from right-to-left.

The feedthrough board 136 includes a feedthrough board substrate 148 as described with reference to FIG. 10, four feedthrough board electric conductors 148V, U, W and X, and first, second, third and fourth feedthrough board terminals 272, 274, 275 and 278. The feedthrough board electric conductors 148V, U, W and X are similar to the feedthrough board conductors described with reference to FIG. 10, except that they are all in the same plane. The first, second, third and fourth feedthrough board terminals 272, 274, 275 and 278 are connected to the feedthrough board electric conductors 148U, V, X and W, respectively. The first and second feedthrough board terminals 272 and 274 are located on an upper surface of the feedthrough board substrate 148 with the first feedthrough board terminal 272 located to the right of the second feedthrough board terminal 274. The third and fourth feedthrough board terminals 275 and 278 are located on a lower side of the feedthrough board substrate 146 with the third feedthrough board terminal 275 to the right of the fourth feedthrough board terminal 278.

In use, a left edge of the feedthrough board 136 is inserted between the lips 270 and urge the first connector contact 232 and the third connector conductor 252 apart. The first connector contact 232 and the third connector conductor 252 are then located on upper and lower surfaces of the feedthrough board 136.

The feedthrough board 136 is then inserted further into the connector 172 until the left edge of the feedthrough board 136 urges the lips 270 near the second connector contact 242 and the fourth connector contact 264 apart. As the feedthrough board 136 moves further into the connector 172, it comes into a stationary position, wherein the first connector contact 232 makes contact with the first feedthrough board terminal 272, the second connector contact 242 makes contact with the second feedthrough board terminal 274, the third connector contact 252 makes contact with the third feedthrough board terminal 275, and the fourth connector contact 264 makes contact with the fourth feedthrough board terminal 278. It can thus be seen that four contacts 230, 242. 252 and 264 of the connector 172 are connected to four feedthrough board terminals 272, 274, 275 and 278 located in the same plane.

The burn-in board 212 includes a burn-in board substrate 280, first, second, third and fourth burn-in board contacts 282, 284, 286 and 288, respectively, and first, second, third and fourth burn-in board electric conductors 290A-290D. The first and second burn-in board contacts 282 and 284 are located on an upper side of the burn-in board substrate 280 and the third and fourth burn-in board contacts 286 and 288 are located on a lower side of the burn-in board substrate 280. The first burn-in board contact 282 is located to the left of the second burn-in board contact 284. The third burn-in board contact 286 is located to the left of fourth burn-in board contact 288.

In use, the burn-in board 212 is inserted from left to right into the connector 172 between the lips 270 near the first and third connector terminals 224 and 244. The burn-in boards 212 urge the first and second connector terminals 224 and 244 apart against spring forces by the first and third terminal spring portions 226 and 246. The first and third connector terminals 224 and 244 slide on upper and lower sides of the burn-in board 212 as the burn-in board 212 is further inserted into the connector 172. The burn-in board 212 is eventually located in a stationary position wherein the first, second, third and fourth connector terminals 224, 234, 244 and 254 simultaneously make contact with the first, second, third and fourth burn-in board contacts 282, 284, 286 and 288, respectively, all located in the same vertical plane. The burn-in board 212 can also be removed to the left out of the connector 172.

Figure 15:
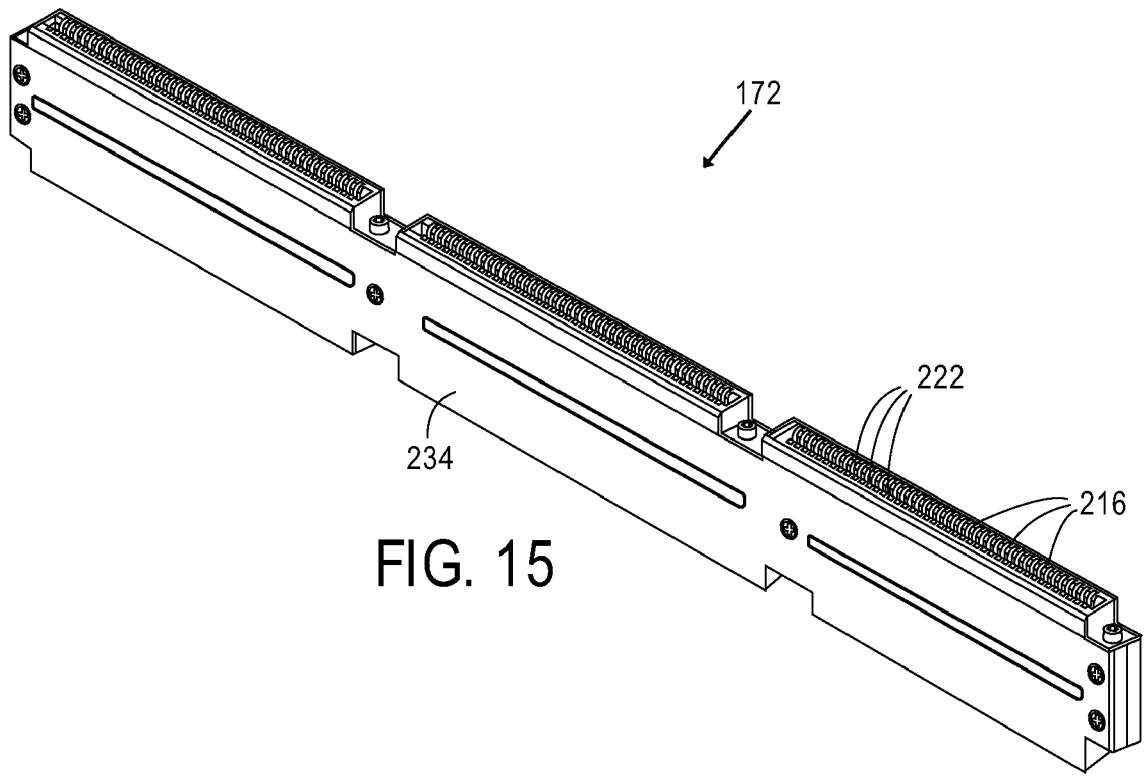
FIG. 15 is a perspective view of the connector of FIG. 14.

As shown in FIG. 15, the connector 172 has a plurality of first conductors 216 and a corresponding plurality of third conductor 222. Although not shown in FIG. 15, it will be appreciated that the connector 172 also has a corresponding plurality of second and third conductors (reference numerals 218 and 220 in FIG. 14).

Figure 16:
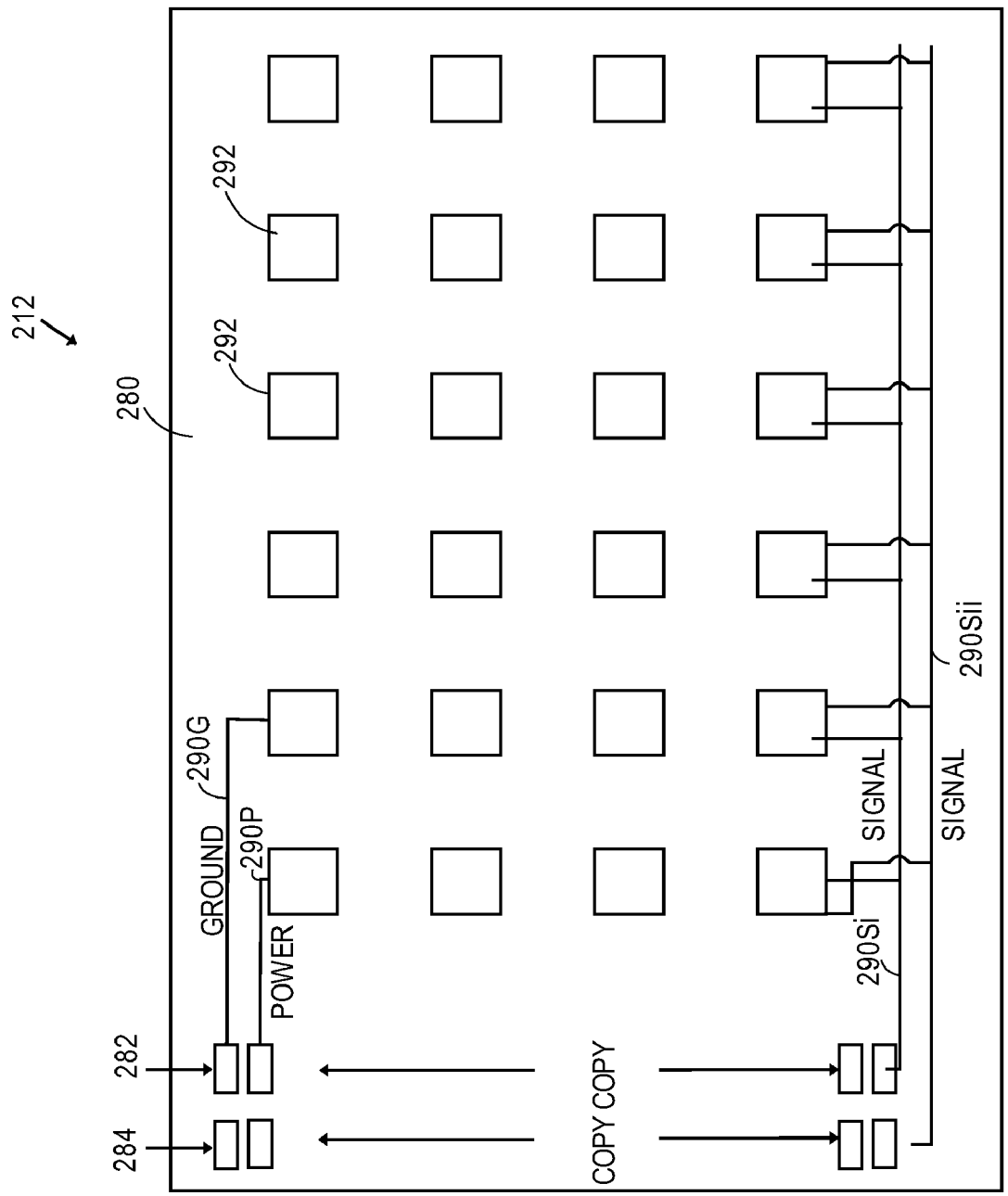
FIG. 16 is a top plan view of the burn-in board shown in FIG. 14.

FIG. 16 illustrates further components of the burn-in board 212, including a plurality of sockets 292, a ground electric conductor 290G, a power electric conductor 290P, and two signal electric conductors 290Si and 290Sii. The sockets 292 are mounted to the burn-in board substrate 280. The electric conductors 290G, 290P, 290Si and 290Sii are similar to the electric conductors 290A-290D described with reference to FIG. 14. The electric conductors 290G, 290P, 290Si and 290Sii connect respective ones of the burn-in board contacts 282 and 284 to terminals within the sockets 292. The sockets 292 are designed to releasably hold and retain electronic devices in the form of integrated circuit packages. Each integrated circuit package has a substrate and a die carrying an integrated circuit mounted to the substrate. The package also includes contacts or wire-bonding wires to connect the integrated circuit and the die electrically to the packaged substrate. The package also includes an encapsulant to protect the die. Although not shown in FIG. 16, it should be appreciated that there are more ground, power and signal electric conductors than the ground, power and signal electric conductors 290G, 290P, 290Si and 290Sii that are shown in FIG. 16. It will also be appreciated that the third and fourth burn-in board contacts 286 and 288 shown in FIG. 14 are located on an opposite side of the burn-in board substrate 280 in FIG. 16 and are similarly connected to the sockets 292 shown in FIG. 16.

In use, the burn-in board 212 and other similar burn-in boards are inserted through the door opening 46 shown in FIG. 3 and are located on the rails 52A and 52B shown in FIG. 5. The door panel 38 is then closed as shown in FIG. 1. Power, ground and signals are provided from the driver boards 122, 124, 126 and 128 in FIG. 10 to and from the sockets 292 in FIG. 16. The temperature gradually raises in an area around the burn-in boards and the temperature is controlled by the oven blower 62, the heater and the damper described with reference to FIG. 7. Once testing of the electronic devices is completed, the door panel 38 is moved into the position shown in FIG. 4 and the burn-in boards are again removed through the door opening 46.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An apparatus for testing an integrated circuit of an electronic device, comprising:
   a test electronics frame;
   a power source;
   a power electrical path connecting the power source to power contacts on the electronic device;
   a signal source;
   a plurality of signal electrical paths, each connecting the signal source to a respective signal contact on the electronic device, the power source and the signal source being located in the test electronics frame and jointly forming part of a test electronics module; and
   a blower frame;
   a blower bearing mount secured to the blower frame;
   a blower mounted the blower frame and jointly being part of a blower module, the blower including a blower bearing held by the blower bearing mount, a blower input shaft held by the blower bearing and being rotatable relative to the blower bearing mount, and a fan mounted on the shaft to rotate together with the shaft, the test electronics frame and the blower frame forming an apparatus frame and being removably mounted to one another, the blower blowing air through at least part of the apparatus frame.

2. The apparatus of claim 1, wherein the apparatus frame includes a driver electronics part and an oven part, the blower being an oven blower and the blower frame being an oven blower frame housing the electronics device, the oven blower being mounted to the oven blower frame and jointly being part of an oven blower module, the oven blower blowing air through the oven, blower part.

3. The apparatus of claim 2, wherein the apparatus frame includes a driver blower frame, further comprising:
   a driver electronics blower mounted to the driver electronics blower frame and jointly being part of an driver electronics blower module, the driver blower blowing air through the driver electronics part, the test electronics module and the driver electronics module being removably mounted to one another.

4. The apparatus of claim 1, further comprising:
   a blower motor bearing mount secured to the apparatus frame;
   a blower motor including:
   a blower motor body secured to the apparatus frame;
   a blower motor stator held by the blower motor body;
   a blower motor rotor rotatably held by the blower motor body;
   a blower motor output shaft connected to the blower motor rotor for rotation therewith, the blower input shaft being driven by the blower motor output shaft.

5. The apparatus of claim 4, further comprising:
   a blower motor pulley connected to the blower motor output shaft;
   a blower pulley connected to the blower input shaft; and
   a drive belt running over the motor pulley and the blower pulley.

6. The apparatus of claim 5, further comprising:
   a spacer component between the apparatus frame and a selected one of the mounts, the spacer component being removable to permit removal of the drive belt.

7. The apparatus of claim 6, wherein selected mount is the blower bearing mount, the blower pulley being located between the blower bearing and the fan.

8. The apparatus of claim 1, further comprising:
   first and second sets of opposing rails, first and second sides of a respective device holder being releasably held by opposing rails of the first and second sets of rails, the air blowing through the rails.

9. The apparatus of claim 8, further comprising:
   a device holder substrate;
   a plurality of device holder terminals on the device holder substrate, each for contacting a respective contact on a respective electronic device;
   a plurality of device holder signal contacts secured to the device holder substrate, each device holder signal contact having a surface for releasably mating with a respective surface of a respective signal connector terminal;
   a plurality of device holder signal conductors connecting the device holder signal contacts to device holder terminals connected to signal contacts on the electronic devices;
   a power contact secured to the device holder substrate, the power connector having a contact surface for releasably mating with a respective surface of a respective power connector terminal; and
   at least one device holder power conductor connecting the device holder board power contact to a power contacts on one of the electronic devices.

10. The apparatus of claim 8, further comprising:
    an interior frame that is removably located within the apparatus frame, the interior frame having first and second opposing vertical sides and the first and second sets of opposing rails being located on the first and second opposing side walls, respectively, of the interior frame.

11. The apparatus of claim 10, wherein the interior frame has third and fourth opposing side walls, further comprising:
    third and fourth sets of opposing rails being located on the third and fourth opposing vertical sides of the interior frame, first and second sides of a first electronics board being releasably held by opposing rails of the third and fourth sets of rails and the first electronics board electrically connecting to the device holder subassembly.

12. The apparatus of claim 11, wherein the interior frame has a fifth vertical side opposing the fourth side wall, further comprising:
    fifth and sixth sets of opposing rails being located on the fourth and fifth opposing vertical sides of the subframe, first and second sides of a second electronics board being releasably held by opposing rails of the fifth and sixth sets of rails and the second electronics board electrically connecting to the device holder subassembly.

13. A method of testing an integrated circuit of an electronic device, comprising:
    holding the device against a surface of a holder so that signal and power terminals of the holder are in contact with signal and power contacts on the electronic device;

providing signals through the signal terminals and contacts to the integrated circuit;

providing power through the power terminals and contacts to the integrated circuit; and blowing air with a blower through at least part of the apparatus frame, wherein the apparatus frame includes a test electronics frame and a blower frame, the power source and the signal source being located in the test electronics frame and forming part of a test electronics module, a blower mount being secured to the blower frame and the blower being mounted to the blower frame and being part of a blower module, the blower including a blower bearing held by the blower bearing mount, a blower input shaft held by the blower bearing and being rotatable relative to the blower bearing mount and a fan mounted on the shaft to rotate together with the shaft.

14. The method of claim 13, further comprising:
removably mounting the test electronics module and the blower module to one another.

15. The method of claim 13, wherein the apparatus frame includes a driver electronics part and an oven part, the blower being an oven blower and the blower frame being an oven blower frame housing the electronics device, the oven blower being mounted to the oven blower frame and jointly being part of an oven blower module, the oven blower blowing air through the oven blower part.

16. The method of claim 15, wherein the apparatus frame includes a driver blower frame, a driver electronics blower mounted to the driver electronics blower frame and jointly being part of a driver electronics blower module, further comprising:
removably mounting the test electronics module and the driver electronics module removably to one another for the driver blower to blow air through the driver electronics part.

17. The method of claim 13, further comprising:
releasably holding first and second sides of a respective device holders by a opposing rails of first and second sets of rails, the air blowing through the rails.

18. The method of claim 17, further comprising:
removing a interior frame out of the apparatus frame, the first and second sets of opposing rails being located on first and second opposing vertical sides of the interior frame.

19. An apparatus for testing an integrated circuit of an electronic device, comprising:
an apparatus frame;
an electric tester including, a power source mounted to the apparatus frame, a power electrical path connecting the power source to power contacts on the electronic device, a signal source, and a plurality of signal electrical paths, each connecting the signal source to a respective signal contact on the electronic device;
a blower bearing mount secured to the apparatus frame, a blower including a blower bearing held by the lower bearing mount, a blower input shaft held by the blower bearing and being rotatable relative to the blower bearing mount, and a fan mounted on the shaft to rotate together with the shaft and blowing air through at least part of the apparatus frame;
a blower motor bearing mount secured to the apparatus frame;
a blower motor including a blower motor body secured to the apparatus frame, a blower motor stator held by the blower motor body, a blower motor rotor rotatably held by the blower motor body, a blower motor output shaft connected to the blower motor rotor for rotation therewith, the blower input shaft being driven by the blower motor output shaft, a blower motor pulley connected to the blower motor output shaft;
a blower pulley connected to the blower input shaft;
a drive belt running over the motor pulley and the blower pulley; and
a spacer component between the apparatus frame and a selected one of the mounts, the spacer component being removable to permit removal of the drive belt.

20. The apparatus of claim 19, further comprising:
a blower mounted to the apparatus frame, the blower blowing air through at least part of the apparatus frame.

21. The apparatus of claim 20, wherein the apparatus frame includes a test electronics frame and a blower frame, the power source and the signal source being located in the test electronics frame and jointly forming part of a test electronics module, and the blower being mounted the blower frame and jointly being part of a blower module, the test electronics module and the blower module being removably mounted to one another.

22. The apparatus of claim 21, wherein the apparatus frame includes a driver electronics part and an oven part, the blower being an oven blower and the blower frame being an oven blower frame housing the electronics device, the oven blower being mounted to the oven blower frame and jointly being part of an oven blower module, the oven blower blowing air through the oven blower part.

23. The apparatus of claim 22, wherein the apparatus frame includes a driver blower frame, further comprising:
a driver electronics blower mounted to the driver electronics blower frame and jointly being part of an driver electronics blower module, the driver blower blowing air through the driver electronics part, the test electronics module and the driver electronics module being removably mounted to one another.

24. The apparatus of claim 19, wherein selected mount is the blower bearing mount, the blower pulley being located between the blower bearing and the fan.

25. An apparatus for testing an integrated circuit of an electronic device, comprising:
an apparatus frame;
a interior frame that is removably located within the apparatus frame, the interior frame having first and second opposing vertical sides and first and second sets of opposing rails being located on first and second opposing sides, respectively, of the interior frame, first and second sides of a respective device holder being releasably held by opposing rails of the first and second sets of rails, third and fourth opposing sides, third and fourth sets of opposing rails being located on the third and fourth opposing vertical sides, first and second sides of a first and second sides of a first electronics board being releasably held by opposing rails of the third and fourth sets of rails and the first electronics board electrically connecting to the device holder subassembly;
a power source mounted to the apparatus frame;
a power electrical path connecting the power source to power contacts on the electronic device;
a signal source; and
a plurality of signal electrical paths, each connecting the signal source to a respective signal contact on the electronic device.

26. The apparatus of claim 25, further comprising:
a blower mounted to the apparatus frame, the blower blowing air through at least part of the interior frame.

27. The apparatus of claim 26, wherein the apparatus frame includes a test electronics frame and a blower frame, the power source and the signal source being located in the test electronics frame and jointly forming part of a test electronics module, and the blower being mounted the blower frame and jointly being part of a blower module, the test electronics module and the blower module being removably mounted to one another.

28. The apparatus of claim 25, wherein the interior frame has a fifth vertical side opposing the fourth side wall, further comprising:
fifth and sixth sets of opposing rails being located on the fourth and fifth opposing vertical sides of the subframe, first and second sides of a second electronics board being releasably held by opposing rails of the fifth and sixth sets of rails and the second electronics board electrically connecting to the device holder subassembly.

29. The apparatus of claim 25, further comprising a first module including:
a first connector including:
a connector body;
a first set of connector terminals on the connector body for connecting to respective ones of a first set of device holder contacts of a device holder;
a first set of connector contacts on the connector body for connecting to respective ones of a first set of board terminals of a board; and
a first set of connector conductors carried by the connector body and connecting the first set of connector terminals to the first set of connector contacts;
a first set of contact spring portions, each contact spring portion of the first set of contact spring portions urging a respective connector contact of the first set of connector contacts against a respective board contact of the first set of board contacts; and
a second set of terminal spring portions, each terminal spring portion of the second set of terminal spring portions urging a respective connector terminal of the second set of connector terminals against a respective hoard terminal of the second set of board terminals.

30. A method of testing an integrated circuit of an electronic device, comprising:
releasably holding first and second sides of a respective device holders by a opposing rails of first and second sets of rails; releasably holding a first electronics board by opposing rails of the third and fourth set of rails;
holding the device against a surface of a first device holder so that signal and power terminals of the holder are in contact with signal and power contacts on the electronic device;
providing signals through the signal terminals and contacts to the integrated circuit;
providing power through the power terminals and contacts to the integrated circuit; and
removing a interior frame out of the apparatus frame, the first and second sets of opposing rails being located on first and second opposing vertical sides of the subframe, the third and fourth sets of opposing rails being located on the third and fourth opposing vertical sides of the subframe.

31. The method of claim 30, further comprising:
blowing air with a blower through at least part of the interior frame.

32. The method of claim 31, wherein the apparatus frame includes a test electronics frame and a blower frame, the power source and the signal source being located in the test electronics frame and forming part of a test electronics module, and the blower being mounted the blower frame and being part of a blower module, further comprising:

removably mounting the test electronics module and the blower module to one another.

33. The method of claim 30, wherein fifth and sixth sets of opposing rails are located on the fourth and a fifth opposing vertical sides of the subframe, first and second sides of the second electronics board being releasably held by opposing rails of the fifth and sixth sets of rails and the second electronics board electrically connecting to the device holder subassembly.

34. An apparatus for testing an integrated circuit of an electronic device, comprising:
(i) an apparatus frame;
(ii) a first connector including:
a connector body;
a first set of connector terminals on the connector body for connecting to respective ones of a first set of device holder contacts of a device holder;
a first set of connector contacts on the connector body for connecting to respective ones of a first set of hoard terminals of a board; and
a first set of connector conductors carried by the connector body and connecting the first set of connector terminals to the first set of connector contacts;
a second set of connector terminals on the connector body, the second set of connector terminals being spaced from the first set of connector terminals in a direction that the device holder engages with the connector body;
(iii) a power source mounted to the apparatus frame;
(iv) a power electrical path connecting the power source to power contacts on the electronic device;
(v) a signal source; and
(vi) a plurality or signal electrical paths, each connecting the signal source to a respective signal contact on the electronic device, at least one of the connector contacts forming part of one of the electrical paths.

35. The apparatus of claim 34, further comprising:
first and second sets of opposing rails, first and second sides of a respective device holder being releasably held by opposing rails of the first and second sets of rails.

36. The apparatus of claim 35, further comprising:
a device holder substrate;
a plurality of device holder terminals on the device holder substrate, each for contacting a respective contact on a respective electronic device;
a plurality of device holder signal contacts secured to the device holder substrate, each device holder signal contact having a surface for releasably mating with a respective surface of a respective signal connector terminal;
a plurality of device holder signal conductors connecting the device holder signal contacts to device holder terminals connected to signal contacts on the electronic devices;
a power contact secured to the device holder substrate, the power connector having a contact surface for releasably mating with a respective surface of a respective power connector terminal; and
at least one device holder power conductor connecting the device holder board power contact to a power contacts on one of the electronic devices.

37. The apparatus of claim 34, wherein the device holder includes first and second sets of device holder contacts spaced from one another on a device holder substrate and contacting the first and second sets of connector terminals respectively.

38. The apparatus of claim 34, further comprising:
a second set of connector contacts on the connector body, the second set of connector contacts being spaced from the first set of connector contacts in a direction that the board engages with the connector body.

39. The apparatus of claim 38, wherein the first set or connector conductors connect the first connector terminals with the first connector contacts, further comprising:
a second set of connector conductors connecting the second set of connector contacts with the second set of connector terminals.

40. The apparatus of claim 39, further comprising:
a first set of terminal spring portions, each terminal spring portion of the first set of terminal spring portions urging a respective connector terminal of the first set of connector terminals against a respective board contact of the first set of board contacts;
a second set of terminal spring portions, each terminal spring portion of the second set of terminal spring portions urging a respective connector terminal of the second set of connector terminals against a respective board contact of the second set of board contacts;
a first set of contact spring portions, each contact spring portion of the first set of contact spring portions urging a respective connector contact of the first set of connector contacts against a respective board contact of the first set of board contacts; and
a second set of terminal spring portions, each terminal spring portion of the second set of terminal spring portions urging a respective connector terminal of the second set of connector terminals against a respective board terminal of the second set of board terminals.

41. The apparatus of claim 39, wherein the board includes first and second sets of board terminals spaced from one another on a board substrate and contacting the first and second sets of connector contacts respectively.

42. The apparatus of claim 34, further including:
a first insulation piece secured against the connector body.

43. The apparatus of claim 39, wherein the first integrated module includes:
a feedthrough board including:
a feedthrough board substrate; and
a first feedthrough board electric conductor carried by the feedthrough board substrate and connected to the first connector contact, the first insulation piece being located against the feedthrough board substrate.

44. The apparatus of claim 39, wherein the first integrated module includes:
a second insulation piece secured to the connector body on an opposite side to the first insulation piece.

45. The apparatus of claim 39, wherein the first integrated module includes:
a feedthrough board including:
a feedthrough board substrate; and
a first feedthrough board electric conductor carried by the feedthrough board substrate and connected to the first connector contact, the first and second insulation pieces being located against and on opposite sides of the feedthrough board substrate.

46. An apparatus for testing an integrated circuit of an electronic device, comprising:
(i) an apparatus frame;
(ii) a first integrated module including:
a connector body;
a first set of connector terminals on the connector body for connecting to respective ones of a first set of device holder contacts of a device holder;
a first set of connector contacts on the connector body for connecting to respective ones of a first set of board terminals of a board; and
a first set of connector conductors carried by the connector body and connecting the first set of connector terminals to the first set of connector contacts; and
an insulation piece secured against the connector body;
(iii) a power source mounted to the apparatus frame;
(iv) a power electrical path connecting the power source to power contacts on the electronic device;
(v) a signal source; and
(vi) a plurality of signal electrical paths, each connecting the signal source to a respective signal contact on the electronic device, at least one of the connector contacts forming part of one of the electrical paths.

47. The apparatus of claim 46, further comprising:
a second set of connector terminals on the connector body, the second set of connector terminals being spaced from the first set of connector terminals in a direction that the device holder engages with the connector body.

48. The apparatus of claim 47, wherein the device holder includes first and second sets of device holder contacts spaced from one another on a device holder substrate and contacting the first and second sets of connector terminals respectively.

49. The apparatus of claim 46, wherein the first integrated module includes:
a feedthrough board including:
a feedthrough board substrate; and
a first feedthrough board electric conductor carried by the feedthrough board substrate and connected to the first connector contact, the first insulation piece being located against the feedthrough board substrate.

50. The apparatus of claim 46, wherein the first integrated module includes:
a second insulation piece secured to the connector body on an opposite side to the first insulation piece.

51. The apparatus of claim 50, wherein the first integrated module includes:
a feedthrough board including:
a feedthrough board substrate; and
a first feedthrough board electric conductor carried by the feedthrough board substrate and connected to the first connector contact, the first and second insulation pieces being located against and on opposite sides of the feedthrough board substrate.

52. The apparatus of claim 51, further comprising:
a plurality of said integrated modules jointly forming an insulated wall.

53. An apparatus for testing an integrated circuit of an electronic device, comprising:
(i) an apparatus frame;
(ii) a first driver board including:
a first driver board substrate;
a first driver board electric conductor carried by the driver board substrate; and
a first driver board terminal connected to the first driver board electric conductor, a first one of the connector contacts being electrically connected to the first driver board terminal; and
(iii) a first connector including:
a connector body;
a first set of connector terminals on the connector body for connecting to respective ones of a first set of device holder contacts of a device holder;
a first set of connector contacts on the connector body for connecting to respective ones of a first set of board terminals of a board; and
a first set of connector conductors carried by the connector body and connecting the first set of connector terminals to the first set of connector contacts, wherein the first connector contact is offset from a line at right angles to a side of the driver board substrate at the driver board terminal to which, it is connected.

54. The apparatus of claim 53, further comprising a first module including:
a first connector including:
a connector body;
a first set of connector terminals on the connector body for connecting to respective ones of a first set of device holder contacts of a device holder;
a first set of connector contacts on the connector body for connecting to respective ones of a first set of board terminals of a board; and
a first set of connector conductors carried by the connector body and connecting the first set of connector terminals to the first set of connector contacts.

55. The apparatus of claim 53, further comprising:
a second set of connector terminals on the connector body, the second set of connector terminals being spaced from the first set of connector terminals in a direction that the device holder engages with the connector body.

56. The apparatus of claim 55, wherein the device holder includes first and second sets of device holder contacts spaced from one another on a device holder substrate and contacting the first and second sets of connector terminals respectively.

57. The apparatus of claim 55, further comprising:
a second set of connector contacts on the connector body, the second set of connector contacts being spaced from the first set of connector contacts in a direction that the board engages with the connector body.

58. The apparatus of claim 57, wherein the first set of connector conductors connect the first connector terminals with the first connector contacts, further comprising:
a second set of connector conductors connecting the second set of connector contacts with the second set of connector terminals.

59. The apparatus of claim 58, wherein the board includes first and second sets of board terminals spaced from one another on a board substrate and contacting the first and second sets of connector contacts respectively.

60. The apparatus of claim 53, further comprising:
a power source mounted to the apparatus frame;
a power electrical path connecting the power source to power contacts on the electronic device;
a signal source; and
a plurality of signal electrical paths, each connecting the signal source to a respective signal contact on the electronic device, at least one of the connector contacts forming part of one of the electrical paths.

61. The apparatus of claim 53, further comprising:
a backplane board including:
a backplane substrate; and
a first backplane electric conductor carried by the backplane substrate and extending from a first driver board terminal plane through the first diver board terminal to a first connector contact plane through the first connector contact, the first driver board terminal plane and the first connector contact plane being spaced and parallel to one another, the first backplane electric conductor connecting the first driver hoard terminal and the first connector contacts electrically to one another.

62. The apparatus of claim 61, wherein the first connector contact plane is parallel to and offset from a plane of the driver board substrate.

63. The apparatus of claim 53, further comprising:
a feedthrough board including:
a feedthrough board substrate; and
a first feedthrough board electric conductor carried by the feedthrough board substrate and extending in a direction other than at right angles to a plane of the first driver board substrate, the first feedthrough board electric conductor connecting the first driver board terminal and the first connector contacts electrically to one another.

64. The apparatus of claim 53, wherein the first feedthrough board electric conductor extends in a direction other than at right angles to a plane of the first driver board substrate.

65. The apparatus of claim 53, wherein the first connector contact is offset from the first driver board terminal in a direction parallel to a plane of the driver board substrate.

66. The apparatus of claim 53, further comprising:
a second driver hoard including:
a second driver board substrate;
a second driver board electric conductor carried by the driver board substrate; and
a second driver board terminal connected to the second driver board electric conductor, the second driver board terminal being connected to the first driver board terminal.

67. The apparatus of claim 66, further comprising;
a feedthrough board including:
a feedthrough board substrate; and
a feedthrough board electric conductor carried by the feedthrough board substrate and connecting the first and second driver board terminals to one another.

68. The apparatus of claim 67, further comprising:
a first backplane board including:
a first backplane substrate; and
a first backplane electric conductor carried by the first backplane substrate and connecting the first driver board terminal and the feedthrough board electric conductor electrically to one another; and
a second backplane board including:
a second backplane substrate separate from the first backplane substrate; and
a second backplane electric conductor carried by the second backplane substrate and connecting the second driver board terminal and the feedthrough board electric conductor electrically to one another.

69. The apparatus of claim 68, wherein the first and second backplane substrates extend in a plane that is at right angles to planes of the first and second driver board substrates and a plane of the feedthrough substrate.

70. The apparatus of claim 66, wherein the first driver board is a power board and the second driver board is a signal board.

71. An apparatus for testing an integrated circuit of an electronic device, comprising:
(i) an apparatus frame defining a door opening;
(ii) a door mechanism including:
a first translation system mounted to the apparatus frame;
a first hinge base mounted to the first translation system, the first translation system allowing for translation of the first hinge base relative to the apparatus frame between a storage position and an operational position;
a door panel mounted to the first hinge base, the door panel being pivotally movable relative to the first hinge base when the first hinge base is in the operational position between a storage orientation wherein the door opening is open and an closed orientation wherein the door panel closes the door opening; and
a latch mechanism that releasably maintains the door in the closed position; and
(iii) an electric tester in the apparatus frame, including:

a power source mounted to the apparatus frame;
a power electrical path connecting the power source to power contacts on the electronic device;
a signal source; and
a plurality of signal electrical paths, each connecting the signal source to a respective signal contact on the electronic device.

72. The apparatus of claim 71, further comprising:
a blower mounted to the apparatus frame, the blower blowing air through at least part of the apparatus frame.

73. The apparatus of claim 72, wherein the apparatus frame includes a test electronics frame and a blower frame, the power source and the signal source being located in the test electronics frame and jointly forming part of a test electronics module, and the blower being mounted the blower frame and jointly being part of a blower module, the test electronics module and the blower module being removably mounted to one another.

74. The apparatus of claim 71, further comprising:
first and second sets of opposing rails, first and second sides of a respective device holder being releasably held by opposing rails of the first and second sets of rails.

75. The apparatus of claim 74, further comprising:
a device holder substrate;
a plurality of device holder terminals on the device holder substrate, each for contacting a respective contact on a respective electronic device;
a plurality of device holder signal contacts secured to the device holder substrate, each device holder signal contact having a surface for releasably mating with a respective surface of a respective signal connector terminal;
a plurality of device holder signal conductors connecting the device holder signal contacts to device holder terminals connected to signal contacts on the electronic devices;
a power contact secured to the device holder substrate, the power connector having a contact surface for releasably mating with a respective surface of a respective power connector terminal; and
at least one device holder power conductor connecting the device holder board power contact to a power contacts on one of the electronic devices.

76. The apparatus of claim 74, further comprising:
a interior frame that is removably located within the apparatus frame, the interior frame having first and second opposing vertical sides and the first and second sets of opposing rails being located on first and second opposing side walls, respectively, of the interior frame.

77. The apparatus of claim 71, further comprising:
a second translation system mounted to the apparatus frame;
a second hinge base mounted to the second translation system, the second translation system allowing for translation of the second hinge base relative to the apparatus frame between the storage position and the operational position, the door panel being mounted to the second hinge base, the door panel being pivotally movable relative to the second hinge base when the hinge base is in the operational position between the storage orientation wherein the door opening is open and the closed orientation wherein the door panel closes the door opening.

78. The apparatus of claim 77, wherein the first and second translation systems are upper and lower translation systems and the door pivots about an axis that is substantially vertical.

79. The apparatus of claim 77, further comprising:
a connecting structure that secures the first and second hinge bases to one another, wherein the first translation system includes a first track that is mounted to the apparatus frame and a first wheel that is rotatably mounted to the first pivot base, the first wheel having an outer surface that rides on the rail.

80. An apparatus for testing an integrated circuit of an electronic device, comprising:
a test electronics frame;
first and second sets of opposing rails in the test electronics frame;
first and second device holder substrates, first and second sides of a respective device holder being releasably held by opposing rails of the first and second sets of rails, the air blowing through the rails;
a plurality of device holder terminals on the device holder substrate, each for contacting a respective contact on a respective electronic device;
a plurality of device holder signal contacts secured to the device holder substrate, each device holder signal contact having a surface for releasably mating with a respective surface of a respective signal connector terminal;
a plurality of device holder signal conductors connecting the device holder signal contacts to device holder terminals connected to signal contacts on the electronic devices;
a power contact secured to the device holder substrate, the power connector having a contact surface for releasably mating with a respective surface of a respective power connector terminal; and
at least one device holder power conductor connecting the device holder board power contact to a power contacts on one of the electronic devices;
a power source;
a power electrical path connecting the power source to the device holder board power contact;
a signal source;
a plurality of signal electrical paths, each connecting the signal source to a respective one of the device holder signal contacts, the power source and the signal source being located in the test electronics frame and jointly forming part of a test electronics module; and
a blower frame;
a blower mounted the blower frame and jointly being part of a blower module, the test electronics module and the blower module forming an apparatus frame and being removably mounted to one another, the blower blowing air through the rails and at least part of the apparatus frame.

81. The apparatus of claim 80, further comprising:
an interior frame that is removably located within the apparatus frame, the interior frame having first and second opposing vertical sides and the first and second sets of opposing rails being located on the first and second opposing side walls, respectively, of the interior frame.

* * * * *